(12) United States Patent
Brueck et al.

(10) Patent No.: US 9,766,123 B2
(45) Date of Patent: Sep. 19, 2017

(54) INTEGRATED BOUND-MODE SPECTRAL/ANGULAR SENSORS

(71) Applicant: STC.UNM, Albuquerque, NM (US)

(72) Inventors: Steven R. J. Brueck, Albuquerque, NM (US); Alexander Neumann, Albuquerque, NM (US); Payman Zarkesh-Ha, Albuquerque, NM (US)

(73) Assignee: STC.UNM, Albuquerque, NM (US)

( * ) Notice: Subject to any disclaimer, the term of this patent is extended or adjusted under 35 U.S.C. 154(b) by 0 days.

(21) Appl. No.: 15/317,592

(22) PCT Filed: Jun. 9, 2015

(86) PCT No.: PCT/US2015/034868
§ 371 (c)(1),
(2) Date: Dec. 9, 2016

(87) PCT Pub. No.: WO2015/191557
PCT Pub. Date: Dec. 17, 2015

(65) Prior Publication Data
US 2017/0108375 A1 Apr. 20, 2017

Related U.S. Application Data

(60) Provisional application No. 62/099,981, filed on Jan. 5, 2015, provisional application No. 62/009,832, filed on Jun. 9, 2014.

(51) Int. Cl.
*G01J 5/02* (2006.01)
*G01J 1/06* (2006.01)
(Continued)

(52) U.S. Cl.
CPC . *G01J 1/06* (2013.01); *G01J 1/44* (2013.01); *G01J 3/18* (2013.01); *G01J 3/2803* (2013.01);
(Continued)

(58) Field of Classification Search
CPC ... G01J 1/06; G01J 3/2803; G01J 3/18; H01L 27/1446; H01L 31/02327; H01L 31/103; G02B 6/122; G02B 6/124
(Continued)

(56) References Cited

U.S. PATENT DOCUMENTS 6,600,169 B2 7/2003 Stintz et al.
7,977,637 B1 7/2011 Yap et al.
(Continued)

FOREIGN PATENT DOCUMENTS

JP 2008-098299 A 4/2008

OTHER PUBLICATIONS

Park, Hye Lyun, "Written Opinion of the International Searching Authority," mailed Aug. 27, 2015 for International Application No. PCT/US2015/034868, filed Jun. 9, 2015, 6 pages.

*Primary Examiner* — Seung C Sohn
(74) *Attorney, Agent, or Firm* — MH2 Technology Law Group LLP

(57) ABSTRACT

A 2-D sensor array includes a semiconductor substrate and a plurality of pixels disposed on the semiconductor substrate. Each pixel includes a coupling region and a junction region, and a slab waveguide structure disposed on the semiconductor substrate and extending from the coupling region to the region. The slab waveguide includes a confinement layer disposed between a first cladding layer and a second cladding layer. The first cladding and the second cladding each have a refractive index that is lower than a refractive index of the confinement layer. Each pixel also includes a coupling structure disposed in the coupling region and within the slab waveguide. The coupling structure includes two materials having different indices of refraction arranged as a grating defined by a grating period. The junction region comprises a p-n junction in communication
(Continued)

with electrical contacts for biasing and collection of carriers resulting from absorption of incident radiation.

21 Claims, 23 Drawing Sheets

(51) Int. Cl.
| | |
|---|---|
| *G01J 3/28* | (2006.01) |
| *G01J 3/18* | (2006.01) |
| *G01J 1/44* | (2006.01) |
| *H01L 27/144* | (2006.01) |
| *H01L 31/0232* | (2014.01) |
| *H01L 31/103* | (2006.01) |
| *H01L 31/02* | (2006.01) |
| *H01L 31/0216* | (2014.01) |
| *G02B 6/122* | (2006.01) |
| *G02B 6/12* | (2006.01) |
| *G02B 6/124* | (2006.01) |

(52) U.S. Cl.
CPC .......... *G02B 6/122* (2013.01); *G02B 6/12004* (2013.01); *G02B 6/124* (2013.01); *H01L 27/1446* (2013.01); *H01L 31/02019* (2013.01); *H01L 31/02164* (2013.01); *H01L 31/02327* (2013.01); *H01L 31/103* (2013.01); *G01J 2001/448* (2013.01)

(58) Field of Classification Search
USPC ........................................................ 250/353
See application file for complete search history.

(56) References Cited

U.S. PATENT DOCUMENTS

| | | | |
|---|---|---|---|
| 8,094,023 | B1 | 1/2012 | El-Kady et al. |
| 9,297,638 | B1 * | 3/2016 | Dyer ................... G01B 9/02001 |
| 2012/0006981 | A1 * | 1/2012 | Van Dorpe ............. B82Y 20/00 |
| | | | 250/227.11 |
| 2012/0154812 | A1 | 6/2012 | Snyman |

* cited by examiner

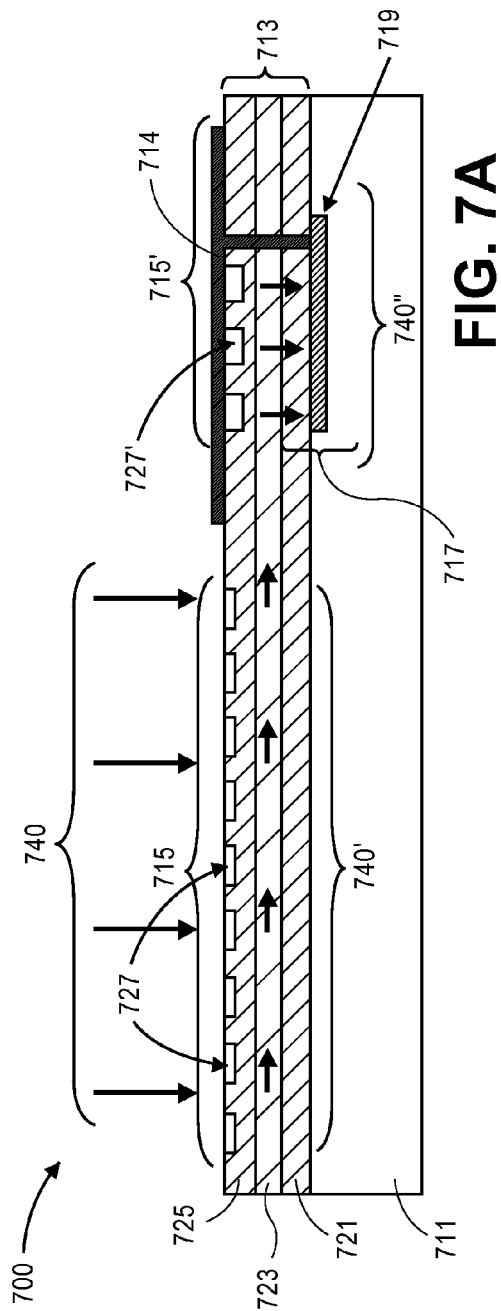
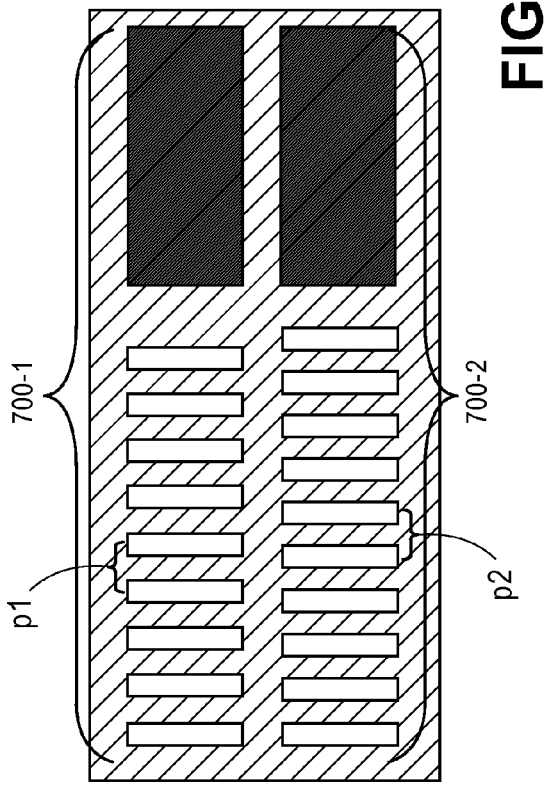
FIG. 7A
FIG. 7B

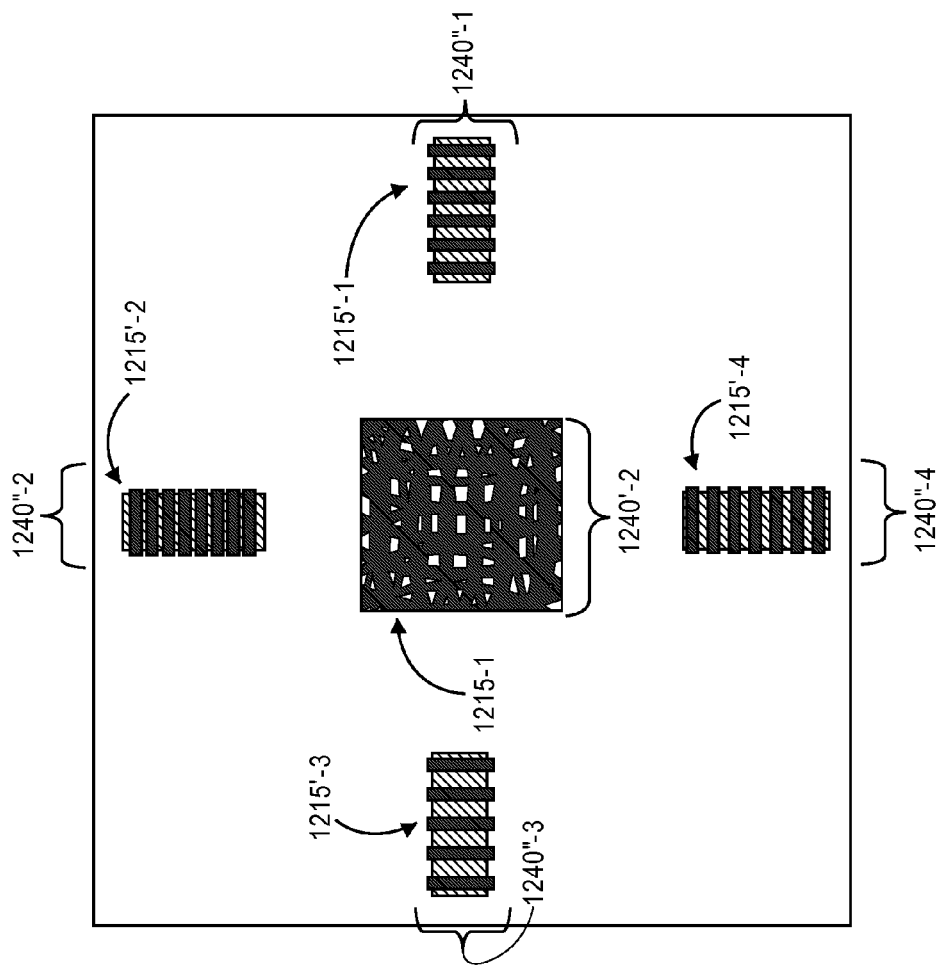
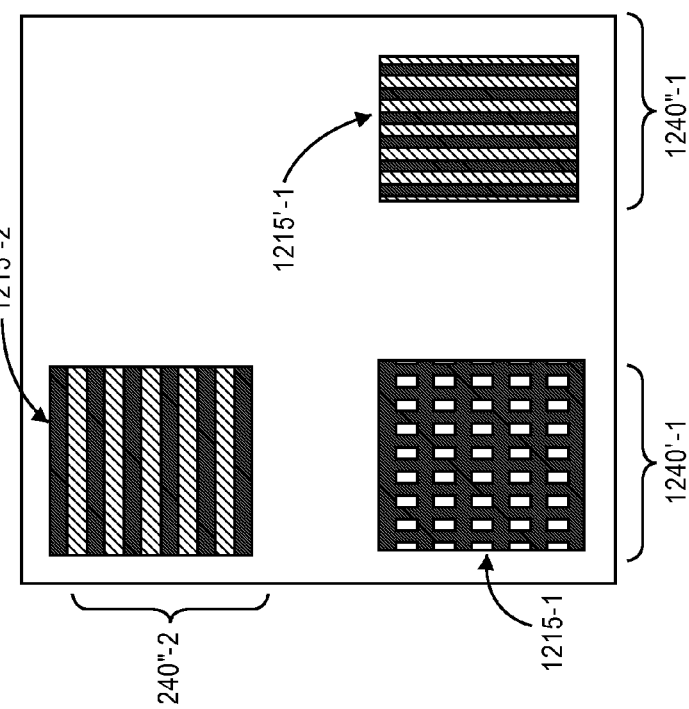
FIG. 12B
FIG. 12A

INTEGRATED BOUND-MODE SPECTRAL/ANGULAR SENSORS

CROSS-REFERENCE TO RELATED APPLICATIONS

This application claims priority to PCT Patent Application No. PCT/US2015/34868 filed on Jun. 9, 2015, which claims priority to U.S. Provisional Patent Application Ser. No. 62/009,832, filed Jun. 9, 2014 and to U.S. Provisional Patent Application Ser. No. 62/099,981, filed Jan. 5, 2015, the entireties of which are incorporated herein by reference.

GOVERNMENT SUPPORT STATEMENT

This invention was made with government support under Grant No. EEC0812056 awarded by the National Science Foundation. The government has certain rights in the invention.

FIELD OF THE INVENTION

This invention relates generally to the field of lighting, particularly smart lighting comprising sensors, and specifically to the field of integrated bound-mode spectral/angular sensors.

BACKGROUND OF THE INVENTION

The ongoing conversion of indoor lighting to energy efficient LED systems offers enormous opportunity for increasing the functionality of lighting from today's modest on/off/dimming control to a new Smart Lighting paradigm that takes advantage of LEDs' electronic compatibility and flexibility. This new lighting paradigm includes lighting for enhanced worker/student productivity, health effects such as circadian entrainment reinforcing the human sleep/wake cycle, visible light communications (VLC) to alleviate the growing wireless bottleneck, and occupancy/activity sensing to provide custom lighting.

The highest lighting efficacy will be achieved with multiple LEDs at different colors across the visible, eliminating the energy losses inherent in phosphor color conversion. VLC will require a multiple-input multiple-output (MIMO) architecture with multiple LEDs from multiple fixtures to provide the necessary aggregate Gbps data rates and to support mobility as people move with their personal devices. Light has many impacts on health and productivity; spectral as well as intensity variations are important for optimizing the human environment. An even greater energy savings, along with a more comfortable experience, is available by adapting lighting to human activity in addition to the savings from the improved efficacy of LEDs.

Currently there is a trend to develop smart lighting that involves multiple LEDs in each light fixture with 4 to 10 independent colors spanning the 400-nm to 700-nm visible spectrum. There is a need in the art to provide smart lighting that will allow a broad color gamut, but also require a sophisticated control system to adapt to different lighting conditions, different impacts of furnishings and walls, floors, ceilings, and/or different aging of the LEDs in different fixtures. While today's color cameras include components, such as photosensitive pixels that could be integrated for use in smart lighting, the angular and spectral resolution requirements needed for smart lighting sensors are quite different than those of traditional cameras that require angular insensitivity and only have pixels with three relatively broad-band and spectrally overlapped color filters (RGB). Most commonly, today's color cameras utilize dye absorbers, typically with spectral bandwidths of ~100 nm or greater that are located directly atop the silicon photosensitive pixels of the camera.

Attempts at developing technology for smart lighting components include focal plane color filters for application to the color pixels of digital cameras. Surface plasma wave (SPW) enhancement of semiconductor detectors has been extensively investigated in the infrared spectral region. Typically, in the IR the approach is to couple to a SPW bound to the metal-semiconductor interface. This allows the use of a thinner absorption region (with, therefore, lower noise currents) and a longer absorption path (along the pixel rather than across the junction depth). However, this approach is not appropriate for the visible spectrum due to the high, and strongly varying, absorption of silicon across the visible spectrum. Another issue is the small scale of the required grating which is $\sim\lambda/n$ with n, the semiconductor refractive index, of 4 to 5 for silicon across the visible spectrum. Additionally, limitations of the SPW approach include: 1) the relatively high metal optical losses in the visible restrict the available bandwidths; spectral widths are typically 100 to 200 nm, an order of magnitude larger than the desired bandwidths; and 2) the transmission is low, typically no larger than 10%, limiting the sensitivity of the measurement.

While there have been many demonstrations of far-field filtering (plane wave to plane wave), relatively few demonstrations of coupling to silicon materials for detection have been presented. In such few demonstrations, linewidths have been broad, typically 100 to 200 nm. The term "plasmonics" generally covers both extended (propagating) surface plasma waves (SPW) defined on a metal-dielectric interface and localized surface plasma resonances (SPR) associated with metal particles, holes in a metal film, discs of metal, etc. The angular responses SPW's and SPR's are quite different with SPW's having a narrow angular response depending on the periodicity of the surface while SPR's have generally angularly independent responses. In any real plasmonic structure these two resonances interact giving a complex, wavelength dependent angular response. Meanwhile, pixels are generally small, driven by trends in high-pixel count cameras where individual pixels are sub-10 microns. Further, many studies have demonstrated a far-field filter approach based on extraordinary optical transmission through arrays of holes in a metal film where the far-field transmission of the filter is used as the spectrally selective quantity. That approach is difficult to achieve in a convenient form factor as a result of the long propagation distances required to achieve a far field regime, requiring standoff of the filter element from the silicon detector array.

Other work has focused on radiation coupling with a 2D waveguide fabricated on a substrate. For example, guided-mode resonance (GMR) filters, consisting of a grating coupler and a single mode slab waveguide on a transparent substrate have demonstrated both angular and spectral sensitivity in reflection and transmission. Off-resonance, GMR filters simply act as a dielectric medium, usually with the majority of the incident power simply being transmitted. On resonance, the grating couples some of incident photons into the waveguide and the propagating photons in the waveguide are coupled back into the reflected and transmitted beams. As a result of the phase shifts inherent in this process, the out-coupled photons reinforce the reflected wave and interfere destructively with the directly transmitted light to reduce the transmitted power. Since the waveguide is lossless and the grating is large (many wavelengths), an extremely narrow resonance response is achieved.

Waveguide integrated optics at telecommunications wavelengths has demonstrated that grating coupling into waveguide modes can provide the necessary spectral and angular filtering with recent demonstrations of only 0.6 dB loss in conversion from a 2D waveguide to a single mode fiber.

What is needed in the art is a device that comprises color pixels with both color and angular sensitivity that can be integrated onto a silicon surface with a scalable, manufacturable process (e.g., not requiring separate fabrication steps for each desired wavelength/angle setting), providing both manufacturing convenience and reduced form factors.

Further, the silicon absorption varies considerably across the visible. At blue wavelengths (about 400 nm) the absorption of silicon is quite strong with a 1/e absorption length of only ~100 nm. In contrast at the red end of the spectrum (about 700 nm) the silicon 1/e absorption length is ~8 micrometers (80× longer). As a consequence, the responsivity of silicon photodetectors also varies across the visible. For blue sensitivity, the junction depth must be quite shallow, within the short 1/e absorption length, which is difficult to accomplish with traditional CMOS fabrication processes. Therefore, another aim of the invention is to provide a CMOS compatible p-n junction technology that accommodates the short penetration depth of blue photons into silicon.

SUMMARY

Some embodiments described herein use grating coupling to bound modes propagating on a metal, which can be coated with a protective layer of silica, and a photon that tunnels through the metal to an underlying silicon p-n junction, for example, a fabricated silicon wafer. Some embodiments described herein use grating coupling to bound modes propagating along the surface of a silicon wafer. These may be surface plasma waves bound to a metal/dielectric interface, or waveguide modes confined by a dielectric stack (typically low index cladding, high index confinement layer, and low index cladding).

In an embodiment, there is a 2-D sensor array. The 2-D sensor array includes a semiconductor substrate, and a plurality of pixels disposed on the semiconductor substrate. Each of the plurality of pixels includes at least one coupling region and at least one junction region, and a slab waveguide structure disposed on the semiconductor substrate and extending from the at least one coupling region to the at least one junction region. The slab waveguide includes a confinement layer disposed between a first cladding layer and a second cladding layer. The first cladding and the second cladding each have a refractive index that is lower than a refractive index of the confinement layer. Each of the plurality of pixels also includes at least one coupling structure disposed in the coupling region and within the slab waveguide. The coupling structure includes at least two materials having different indices of refraction, and arranged as a grating defined by a grating period. The junction region comprises a p-n junction in communication with electrical contacts for biasing and collection of carriers resulting from absorption of incident radiation.

In another embodiment there is a 2-D sensor array. The 2-D sensor array comprises a plurality of pixels including at least a first pixel and a second pixel. Each of the first and second pixels include a slab waveguide portion, a single mode waveguide portion, an adiabatic taper portion for funneling incident light from the slab waveguide portion into the single mode waveguide portion, and a plurality of resonant add-drop filters formed substantially adjacent to the single mode waveguide portion. The slab waveguide comprises a confinement layer disposed between a first cladding layer and a second cladding layer, wherein the first cladding and the second cladding each have a refractive index that is lower than a refractive index of the confinement layer, and a grating disposed in the first cladding layer for coupling incident light into the slab waveguide. The first pixel's grating has a first grating period and the second pixel's grating has a second grating period.

In another embodiment there is a CMOS-compatible photodetector. The CMOS-compatible photodetector comprises a first semiconductor layer doped with a first carrier type and a second semiconductor layer doped with a second carrier type. The first semiconductor layer comprises a plurality of posts. The second semiconductor layer is configured with a plurality of holes extending through the second semiconductor layer. At least one of the posts extends through a corresponding one of the plurality of holes in a honeycomb pattern. The honeycomb pattern comprises a plurality of edge portions, each of the plurality of edge portions comprising a respective one of a depletion region area.

In another embodiment there is a method of detecting electromagnetic radiation. The method includes providing a 2-D sensor array. The 2-D sensor array comprises: a semiconductor substrate comprising a plurality of pixels. Each of the plurality of pixels comprises at least one coupling region and at least one junction region, a slab waveguide structure disposed on the semiconductor substrate and extending from the coupling region to the junction region, and a localized semiconductor layer forming at least one p-n junction with the semiconductor substrate in the junction region. The slab waveguide comprises: a confinement layer disposed between a first cladding layer and a second cladding layer, wherein the first cladding and the second cladding each have a refractive index that is lower than a refractive index of the confinement layer. The pixels further comprise at least one grating disposed in the slab waveguide. The at least one grating comprises a grating period. The method also includes coupling incoming light into the slab waveguide at the coupling region, propagating the light to the region over the junction area, decoupling the light such that it enters the junction region, and converting the light into at least one electron-hole pair, wherein the incoming light comprises at least one modulated waveform.

Advantages of the embodiments will be set forth in part in the description which follows, and in part will be understood from the description, or may be learned by practice of the invention. The advantages will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate embodiments of the invention and together with the description, serve to explain the principles of the invention.

BRIEF DESCRIPTION OF THE DRAWINGS

FIGS. 7A-7B illustrate a side cross-sectional view (FIG. 7A) and a top view (FIG. 7B) of a waveguide filter of an embodiment.

FIGS. 12A-12B are each top views of respective a waveguide filter of an embodiment and each further illustrate the use of more complex grating couplers to extend the functionality to multiple wavelengths with a combined coupling area.

DESCRIPTION OF THE EMBODIMENTS

Figure 1:
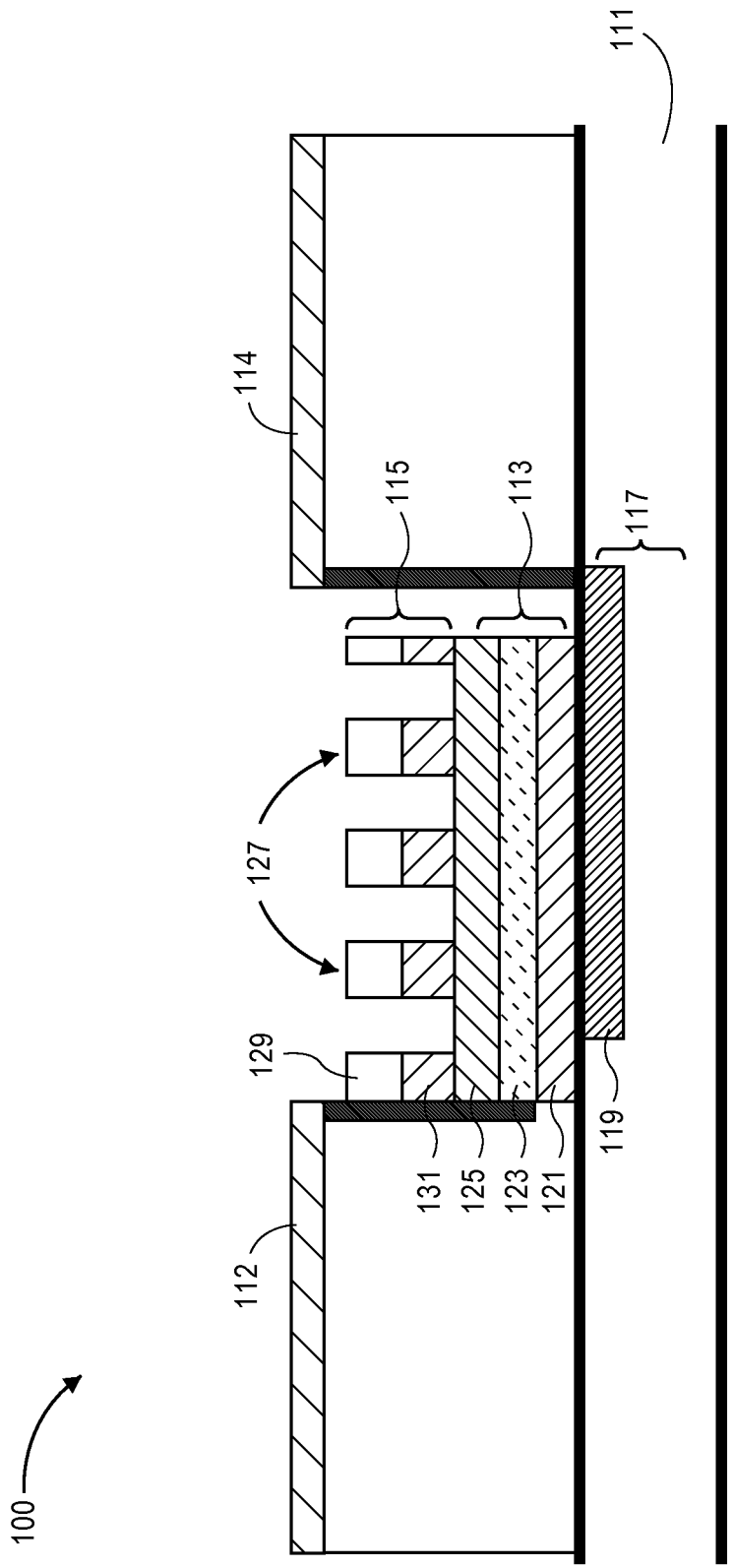
FIG. 1 is a cross-sectional view of elements of a CMOS compatible integrated plasmonic detector.

Reference will now be made in detail to the present embodiments, examples of which are illustrated in the accompanying drawings. Wherever possible, the same reference numbers will be used throughout the drawings to refer to the same or like parts.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less that 10" can assume negative values, e.g. −1, −2, −3, −10, −20, −30, etc.

The following embodiments are described for illustrative purposes only with reference to the Figures. Those of skill in the art will appreciate that the following description is exemplary in nature, and that various modifications to the parameters set forth herein could be made without departing from the scope of the present invention. It is intended that the specification and examples be considered as examples only. The various embodiments are not necessarily mutually exclusive, as some embodiments can be combined with one or more other embodiments to form new embodiments.

A CMOS-compatible plenoptic (angle and wavelength) detector for LED lighting applications is described herein. In some embodiments, the plenoptic sensor has both spectral (≤30 nm) and angular (100 mrad; 5°) resolution. Furthermore, such a sensor may be based on a scalable silicon IC platform to meet mass-market cost targets, may have a low profile for broad installation flexibility, and does not have any moving parts such as a grating rotation for manufacturing and operational simplicity and robustness.

Described herein are embodiments of a plenoptic sensor waveguide detector element. The detector element of the embodiments may be incorporated in one or more pixels such as a 2-D pixel array which may be included in CMOS-compatible photodetector. In such embodiments, grating coupling is used to bound modes propagating along the surface of the silicon wafer. The bound modes may be surface plasma waves bound to a metal/dielectric interface as in sensor elements 100, 300 and 400 shown in FIG. 1, or waveguide modes confined by a dielectric stack (typically low index cladding, high index confinement layer, and low index cladding) as in sensors element 600 of FIG. 6A, sensor element 600' of FIG. 6C, sensor element 700 of FIG. 7A, and sensor element 800 of FIG. 8A.

In either case the phase matching condition for coupling is given by equation (1):

$$\frac{2\pi \sin\theta_{in}}{\lambda_{in}} + j\frac{2\pi}{d} = \pm k_{mode}(\lambda_{in}), \quad (1)$$

where $\theta_{in}$ is the angle of incidence ($-1 < \sin \theta_{in} < 1$), j is an integer ($\pm 1, \pm 2, \ldots$), $\lambda_{in}$ is the optical wavelength, d is the grating period; and $k_{mode}(\lambda_{in})$ is the modal wave vector typically given by a dispersion relation that takes into account the waveguide structure and the incident wavelength.

If light is incident at varying angles as it is, for example, for a sensor mounted on a wall where light comes directly from multiple luminaires (i.e., separated and extended light sources such as light bulbs or LEDs) and also from multiple bounces around the room, according to coupling equation (1) light at different angles is coupled in at different wavelengths. That is, the coupling equation (1) depends both on the angle of incidence and the wavelength. This problem must be resolved to provide a sensor output of spectrum vs. angle of incidence. Since the goal is the spectrum as a function on angle of incidence, this dependence is desired. However, it is necessary to deconvolve the two axes from the measurement. Thus, two measurement axes are required to separate out the two dependencies. One measurement axis is provided by varying the period of the grating on adjacent pixels. The second measurement axis requires either: a) a blind structure above the detector active surface to control the angle of incidence, or b) a resonant frequency measurement structure (similar to a series of resonant add-drop filters along the waveguide) to separate out the spectrum. Thus, by fixing one axis directly, for example, either the angle (in the case of the blinds) or wavelength (in the case of the resonant filters) as a measured signal, the other axis can be deduced from the measured signal. In the case of the blind structure, there is a part that sets the angle, and the received color is then a function of the grating pitch. In the case of the waveguide structure, there is a part that provides a convolution of angle and wavelength (corresponding to sin $\theta/\lambda$) and then a series of resonant add-drop filters that provide wavelength information.

For electronically controllable LEDs, each color can have a unique electronic signature that can encode the color eliminating the need for direct wavelength measurement. That is, the signals can be separated electronically. This electronic coding can be at a frequency well above human perception, so it has no impact on the lighting functionality.

Surface Plasma Wave Spectral/Angular Detection

In one set of embodiments, the spectral/angular separation is accomplished with a plasmonic guiding structure atop the silicon detector. As long as $\mathrm{Re}(\epsilon_d + \epsilon_m) < 0$, a metal film supports a surface plasma waves (SPW) associated with the metal/dielectric interface on each side of the metal film. The SPE is a bound mode that propagates along the interface and decays exponentially into both the metal and the dielectric.

For a $Ag/SiO_2$ interface this condition is satisfied across the visible. For a Ag/Si interface this condition is violated at the blue end of the spectrum, so that the SPW does not exist across the entire visible. Thus in this set of embodiments, the coupling is to the upper Ag/dielectric interface. For a sufficiently thin metal, there the SPW also mediates the transmission through the metal leading to a spectral/angular response at the underlying p-n junction.

As shown in FIG. 1, in some embodiments, a plenoptic sensor element 100 may comprise a semiconductor substrate 111. A surface plasma wave supporting structure 113, a grating coupler 115 and a photodetector 117 may each be disposed over the sensor element 100. The substrate may be a silicon substrate, for example a p-type silicon substrate. While some of the embodiments described herein include a p-substrate with an n-diffusion to create the junction area, other configurations are possible. For example, embodiments described herein may instead include n-substrate used with a p-diffusion to create the junction. The photodetector may include a thin n-type diffusion layer 119 incorporated in the substrate 111. The plasmonic structure 113 may be formed with a plasmonic layer 123 which may comprise a metal disposed over the substrate 111. In certain embodiments, the plasmonic layer 123 may be a thin continuous metal sheet which minimizes the required manufacturing steps and, therefore, production cost. The plasmonic layer 123 may comprise aluminum which provides the best known plasmonic performance in blue light region.

In certain embodiments a protection layer 125 can be added between the plasmonic layer 123 and the grating 115. The protection layer 125 protects the plasmonic layer 123 from airborne contamination and deteriorating substances. The protection layer may comprise alumina which may be deposited using evaporation, laser or e-beam ablation or atomic layer deposition (ALD) techniques.

In certain embodiments a spacer layer 121 with low refraction index can be added as a spacer between a metal sheet of the plasmonic layer and the registering device. Such a spacer benefits spectral response (selectivity) of the device by substantial attenuation of evanescent fields caused by zero- and all higher orders except for the light coupled into plasmons which exhibit leaky mode behavior. In an embodiment, the low-index dielectric layer 125 may comprise $Al_2O_3$, and/or the spacer layer 121 may comprise $SiO_2$.

A grating can be disposed over the plasmonic layer 123 for coupling of light into the surface plasmons. In certain embodiments a plurality of periodic structures 127, such as a plurality of Si/Air periodic structures, can be used as a coupling grating 115. Such a coupling grating has one of the highest refractive index contrasts available in the visible light range thus providing high coupling efficiency while retaining high compatibility with CMOS processing. In certain embodiments a coupling grating can be implemented as a high permittivity element 129 (semiconductor or metal) placed on top of a low refractive index spacer element 131, such as a dielectric, which may be $SiO_2$. Such a combination of high permittivity element 129 with low refractive index spacer element 131 provides for high grating coupling efficiency connected with reduced effective refractive index of surrounding media within plasmonic evanescent field.

Figure 2A:
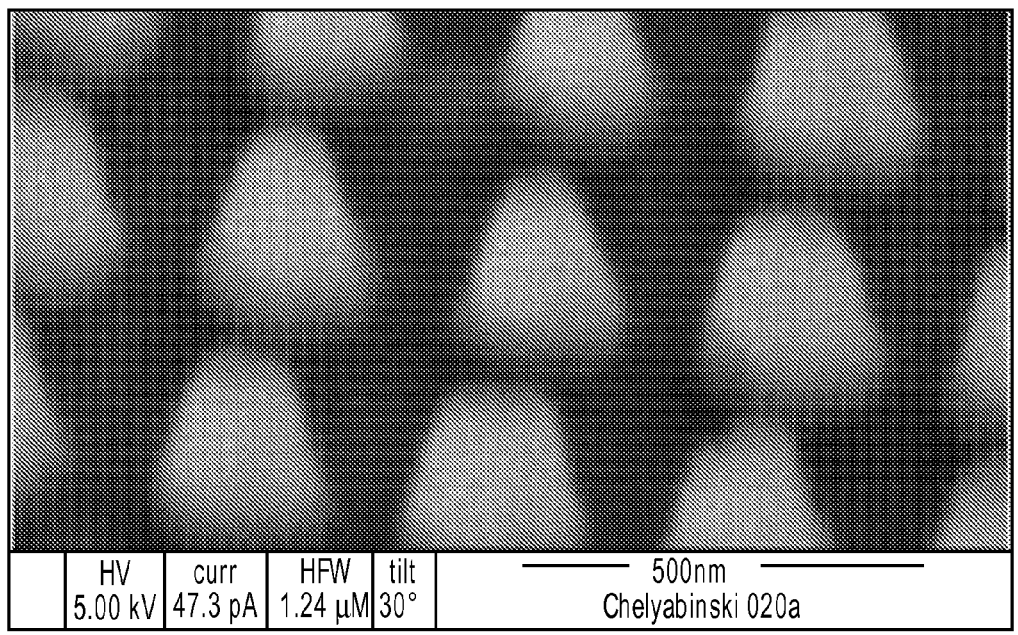
FIGS. 2A-2B are images showing different scanning electron micrograph (SEM) views of exemplary 2D gratings on the top of a plasmonic structure.
Figure 2B:
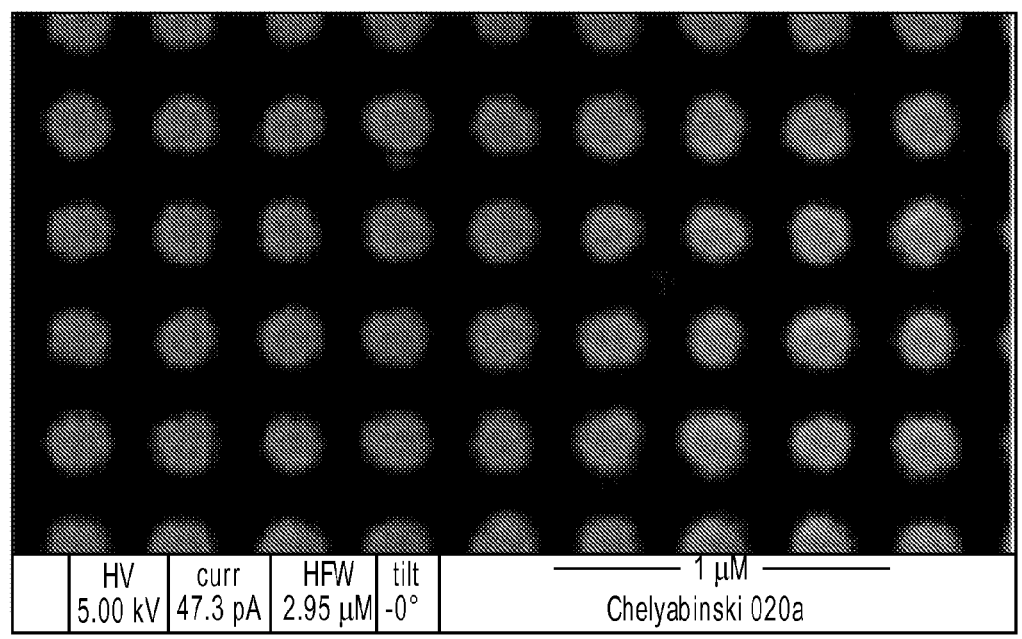

This allows having the same filtering window with a larger grating pitch thus easing fabrication. In certain embodiments a 1D coupling grating can be used to incorporate polarization sensitivity to the plenoptic sensor. In certain embodiments 2D square (FIGS. 2A-2B) or 2D hex-patterned (not shown) coupling grating can be used for enabling polarization insensitive operation.

Returning to FIG. 1, a period of the grating 115, for example, the period of the periodic structure 127 can be approximately $\lambda/n_d$, where $n_d$ is the index of the dielectric. The surface plasmon at the silicon/metal interface is not well defined since the dielectric constant ($\in$) of the silicon ($\in$=16 to $\in$=25 across the visible) is larger than the magnitude of the real part of the metal ($\in$~10). Instead, embodiments couple to a plasmon on the other side of the plasmonic layer 123 (which may coated with a protective spacer layer 121 of silica, $\in$~2.25) and tunnel the photon through the thin metal to the underlying silicon. In other words, the plenoptic sensors element 100 can provide coupling to the (low-index) dielectric 125 above a plasmonic layer 123 and transmission through the plasmonic layer 123 to the underlying semiconductor.

The sensor element 100 may further include a surface plasma wave (SPW) contact 112 that contacts at least the plasmonic layer 123 and an n-contact 114 that contacts the n-type diffusion layer 119. The sensor element 100 may further include a p-contact (not visible in FIG. 1).

Figure 3:
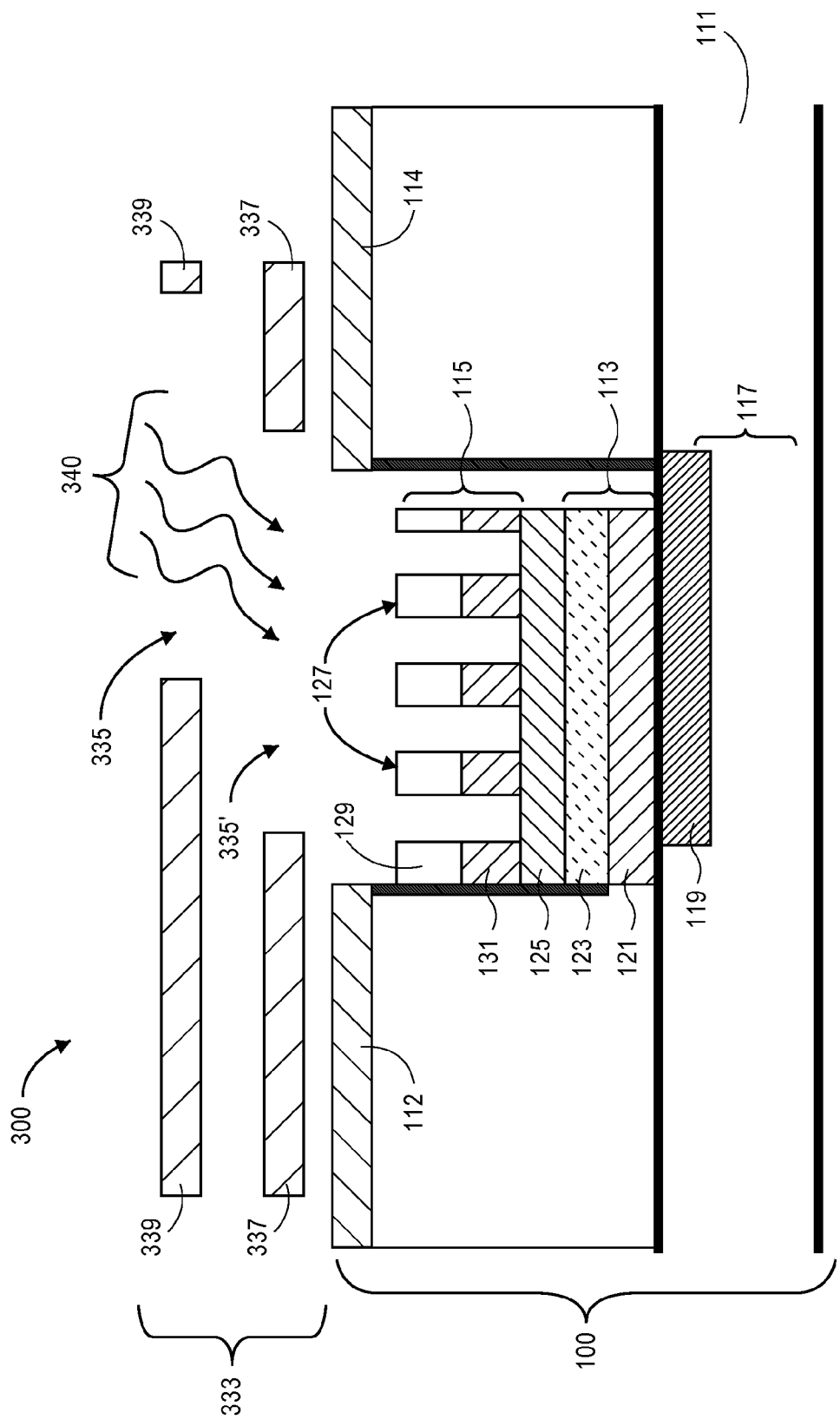
FIG. 3 is a side, cross-sectional view of an exemplary implementation of a mechanical light aperture on the top of a plasmonic structure using interconnect layers.

As discussed above, an additional filtering structure 333 can be used to resolve angular-wavelength degeneracy of the plasmonic filtering structure as illustrated in FIG. 3. For example, in certain embodiments mechanical light apertures 335, 335' can be used as additional filtering structure disposed over device 100 as shown in FIG. 3. The mechanical light aperture reduces the angular spread of the light 340 incident on a particular device element, thus eliminating the degeneracy.

Figure 4:
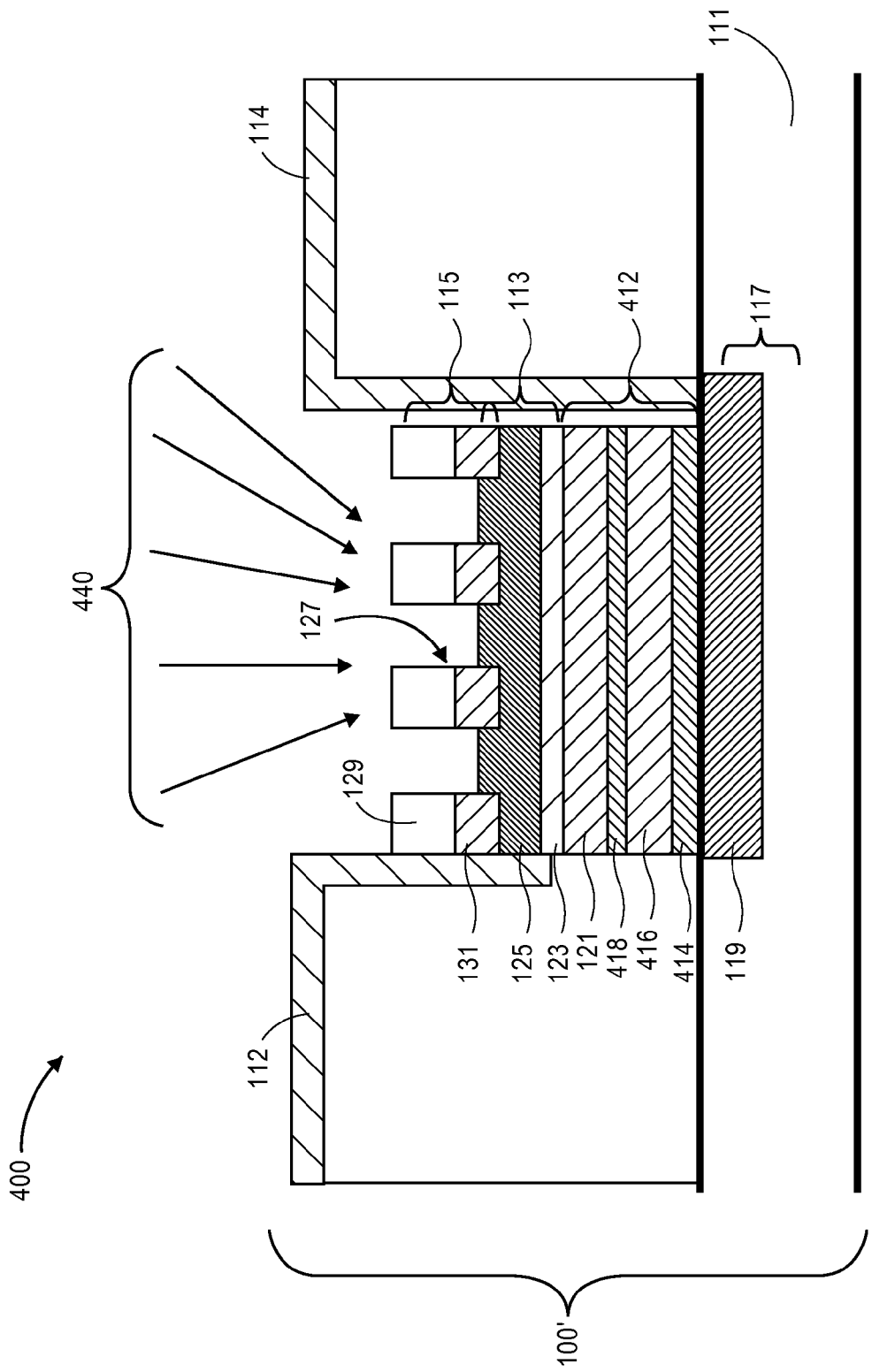
FIG. 4 is a cross-sectional view of an exemplary implementation of wavelength resonant structures placed between a plasmonic device and a photodetector.

In certain embodiments at least one of a wavelength resonant structure 412, as shown in FIG. 4, can be incorporated in a plenoptic sensor element 400. The wavelength resonant structure 412 may be added to element 100 as described below. For example, an additional filtering structure may be placed between the plasmonic layer 123 and photo-detector 117, thereby modifying element 100 of FIG. 1 as element 100' as shown in FIG. 4. The wavelength resonant structure 412 may include alternating dielectric layers 414, 416, and 418, and may further incorporate layer 121. Together the alternating dielectric layers 414, 416, 418 and 121 are configured as several Fabry-Perot resonators with different free-spectral ranges and center frequencies designed in such a way that only a particular bandwidth of continuum is passed through thus eliminating the degeneracy.

Figure 5A:
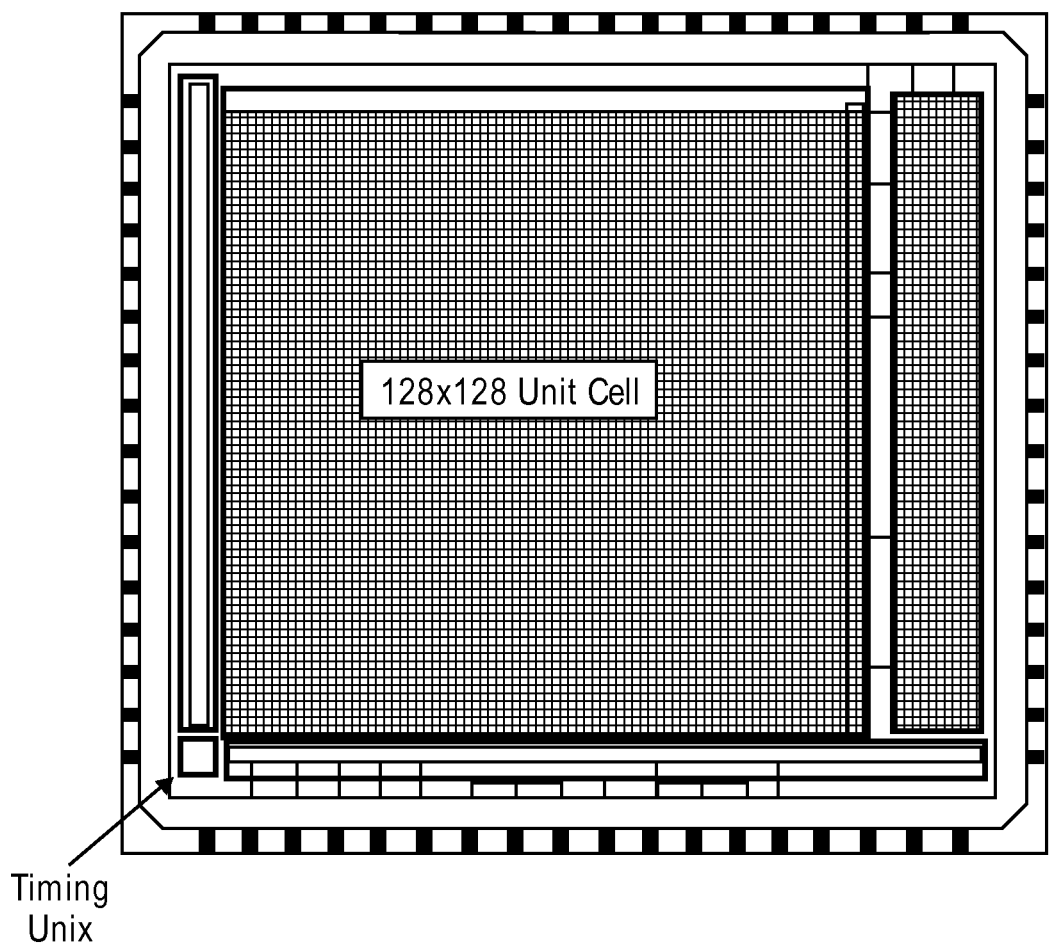
FIGS. 5A-5B show a sensor comprising a dense array of photodetectors (FIG. 5A) that are accessed electronically via an on-chip circuitry shown as a block diagram (FIG. 5B).

In certain embodiments a complete sensor consists of an array of wavelength/angular p-n-junction photodetectors that are accessed using on-chip electronics. An example of such array is shown on FIG. 5A. The array comprises a plurality of pixels, with each pixel comprising a respective one of plenoptic sensor element 100, 300 or 400 described above.

Figure 5B:
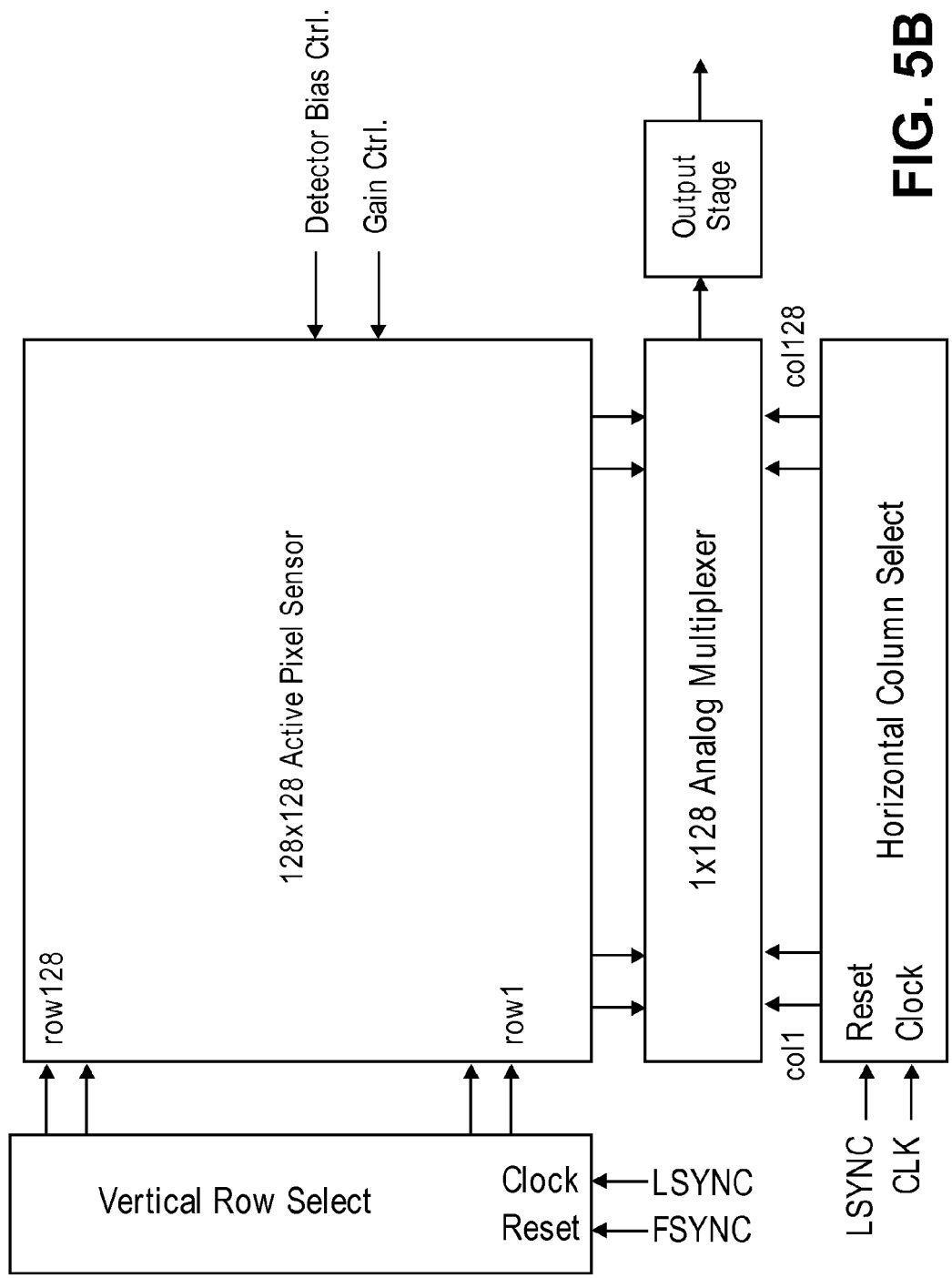

The plasmonic structure can comprise a continuous metal sheet formed between a protective layer, such as a first dielectric layer, and a second dielectric layer, wherein the continuous metal sheet comprises silver. The angular filtering structure comprises a mechanical light aperture for reducing angular spread of the incident light and reducing degeneracy. The plasmonic structure can further comprise a grated dielectric layer formed on the first dielectric layer. The grated dielectric layer and the second dielectric layer can each comprise $SiO_2$ and/or the first dielectric layer can comprise $Al_2O_3$. The coupling grating can comprise a grated semiconductor/air periodic structure. The coupling grating can comprise a high permittivity element selected from a semiconductor or a metal disposed on a low refractive index spacer, wherein the high permittivity element can comprise a higher permittivity than the low refractive index spacer. The coupling grating can comprise a 1-D coupling grating, a 2D square coupling grating, or a 2D hex-patterned coupling grating. Each of the first and second pixels can further comprise a photodetector and a wavelength resonant filtering structure, wherein the wavelength resonant filtering structure is disposed between the plasmonic structure and the photodetector. The wavelength resonant structure can comprise a plurality of Fabry-Perot resonators, each with a corresponding free-spectral range and center frequency, wherein the Fabry-Perot resonators can be configured to allow only passage of a predetermined bandwidth of light continuum through the plasmonic device. The pixels of the 2-D array sensor can be in electrical communication with on-chip electronics or it can be bonded to a readout integrated circuit (ROIC) as shown in FIG. 5B. The 2-D array can further comprise a semiconductor substrate and a plurality of p-n junctions. The plurality of pixels may be disposed on the semiconductor substrate.

Dielectric Waveguide Spectral/Angular Detection

All dielectric-confined guided modes offer a lower loss alternative to metal-dielectric SPWs. Thus, in an embodiment there is provided waveguide coupling into waveguide modes for spectral and angular filtering to the visible spectrum, using lossless waveguides integrated with CMOS-compatible Si photodetectors. Plenoptic sensors comprising waveguides as described herein easily meet the spectral and angular resolution requirements described above, are readily scalable to array architectures, and easily will provide the RF bandwidths and out-of-band rejection required for visible light communications, VLC.

Figure 6A:
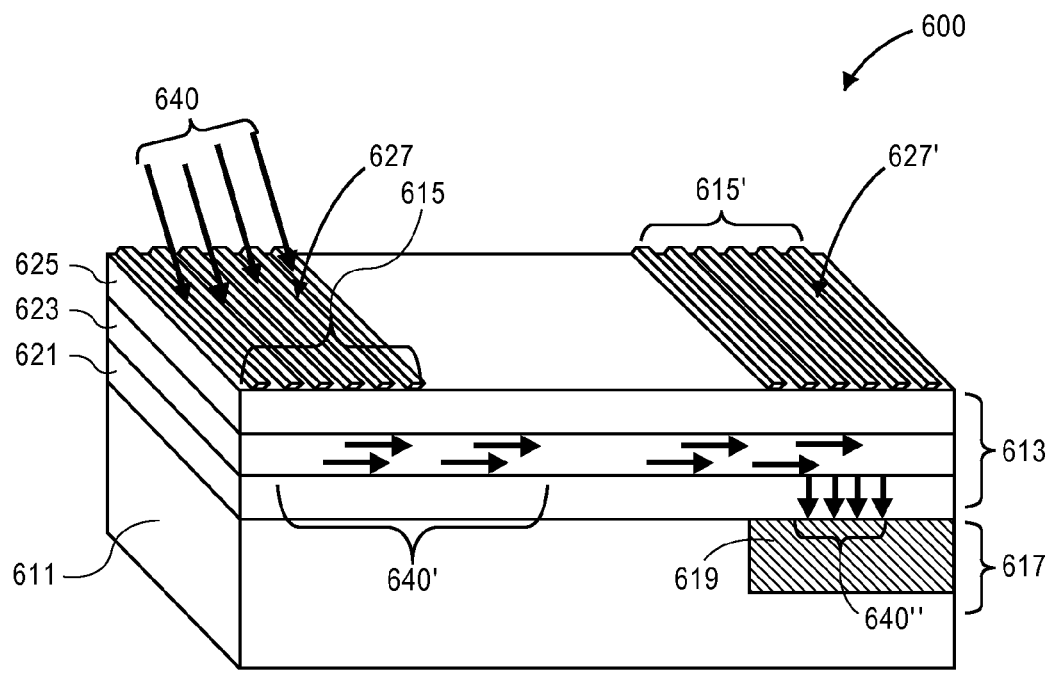
FIG. 6A is perspective view of an integrated waveguide enhanced CMOS compatible plenoptic detector element according to an embodiment.
Figure 6B:
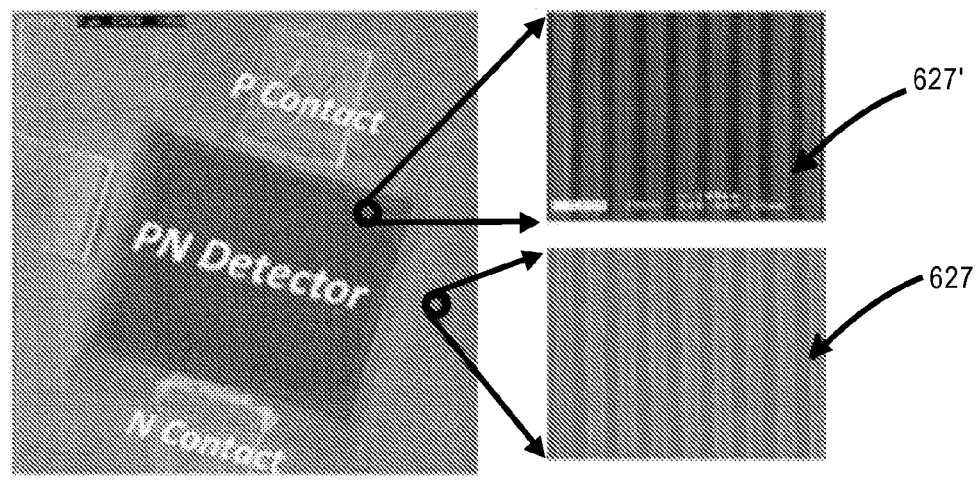
FIG. 6B is an optical micrograph image of a fabricated integrated waveguide enhanced CMOS compatible plenoptic detector element according to the structure shown in FIG. 6A. The insets are SEM images of the gratings in the coupling and detection regions.

To retain the CMOS compatibility, a plenoptic sensor element 600 in FIG. 6A may include a three layer waveguide structure 613. The waveguide structure 613 may include a first low index cladding layer 621, a high index confinement layer 623, and a second low index cladding layer 625 (e.g., a $SiO_2/Si_3N_4/SiO_2$ waveguide) disposed over a substrate 611, which may be a silicon substrate. The first low index cladding layer 621 and the second low index cladding layer 625 may each comprise $SiO_2$. The high index confinement layer 623 may comprise $Si_3N_4$. The refractive indices of the waveguide layers include are: $SiO_2$-1.5, $Si_3N_4$~2.2. The layers of the waveguide structure may be transparent across the visible spectrum. One of ordinary skill will understand that other material combinations for the waveguide layers are available and are included herein without explicit reference.

In operation, incident light 640 is coupled to the waveguide 613 at a specific wavelength and incident angle at a coupling region 640', providing a spectral/angular filtering function. The incident light is coupled into the waveguide 613 by a grating coupler 615 located at a coupling region 640'. The grating coupler 615 comprises a plurality of dielectric grates 627. The light is then out-coupled from the waveguide 613 downstream from the coupling region at an out-coupling grating 615' located at junction region 640" to a photodetector 617 fabricated in the underlying silicon substrate 611 and comprising at least one p-n junction. A second grating at a junction area 615' is used to out-couple the light into the semiconductor detection region of the photodetector. Thus, the thickness of the first low index cladding layer 621 should be selected to ensure that the fields do not extend significantly into the absorptive silicon substrate 611, the thickness of the confinement layer 623 should be selected to assure single mode in the deposition direction, and a thickness of the second low index cladding layer 625 should be selected to control the coupling strength.

The p-n junction is first defined with an appropriate doping profile. Since the active areas are quite large, one alternative is to use a simple diffusion process to define the junction areas. Alternatively, ion-implantation and annealing can be used as is well known in the art. Following the junction formation, blanket layers of the waveguide—lower cladding, waveguide core, and upper cladding—are deposited by an appropriate deposition technique. Techniques such as sputtering, evaporation and spin coating among others are available and are well-known. One or more lithography and pattern transfer steps are next used to define the in-coupling and out-coupling regions. Additional standard lithography/etch/metal deposition/annealing steps are used to provide the electrical contacts and the cover over the p-n junction to protect it from direct illumination.

Figure 6C:
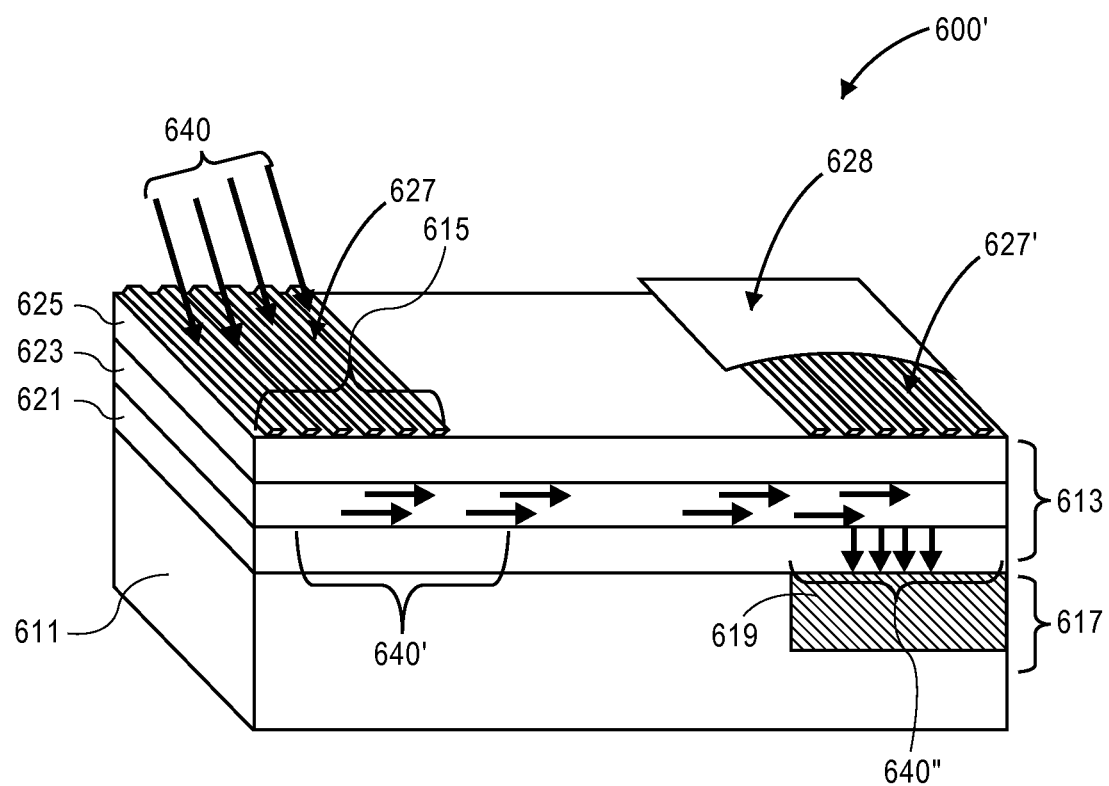
FIG. 6C is a perspective view of another embodiment of an integrated sensor detector element.

As shown in FIG. 6C, an alternate structure of an integrated plenoptic sensor element 600 includes a waveguide 613 as well as a first grating 627 and a second grating 628. With a cover 628' over a detector area, such as over a portion of second grating 615', to eliminate direct illumination of the detector element. Cover 628' may be an opaque material, for example a metal thicker than ~100 nm. A separation layer (not shown) may be necessary depending on the thickness of the upper cladding and the etch depth of the coupler.

In an example, the photodetector 617 may comprise an n-doped region 619 of the substrate 611 which may be a p-type substrate. A plenoptic sensor will require an array of pixels comprising such detection elements, at least two of the elements having different pitch or orientation gratings. A grating coupler 615 along with the single mode slab waveguide 613 provides the necessary angular/wavelength selectivity as is evident from the coupling equation (1) described above.

The parameters of the waveguide are chosen to provide a single (TE, TM) mode pair across the visible allowing the use of different gratings to adjust the individual pixel angular/wavelength coupling resonances.

In a single mode slab waveguide, the modal index of this slab varies across the range of 1.5 (at long wavelengths, e.g. the refractive index of the cladding) to 2.2 (at short wavelengths, e.g. the refractive index of the core). Without the grating, there is no coupling for light incident on this waveguide from the top since the mode phase velocity is always slower than the speed of light in free space. Just as in the SPW case, this momentum deficit can be made up with a grating. Very high coupling efficiencies, approaching 100%, are readily achieved. Since the waveguides are lossless, the resonance line widths are much smaller than in the SPW case. The measured linewidth is a function of: 1) the width of the grating; 2) the illuminated grating width; and 3) the grating coupling strength. As illustrated below, with an illuminated grating width of 200 µm in the weak coupling limit, a resolution of ~5 nm was achieved with a 200 µm wide coupling area. It is possible to adjust the resonance linewidths by several techniques: 1) chirping (varying the pitch across the collection area) the grating, and 2) including a lossy element, for example but not restricted to silicon nanoparticles in the waveguide to increase the waveguide losses. It will be necessary to design an appropriate engineering compromise between the resonance bandwidth and the propagation lengths between the coupling region and the detection region.

In one implementation of a plenoptic sensor element shown in FIGS. 7A-7B, incident light 740 is coupled into a slab waveguide 713 by a first dielectric coupling grating 727 located at a coupling area 740'. As the light propagates under a metal block 714, which is placed to shield the p-n junction between n-type portion 719 of the p-type substrate 711, a second out-coupling grating 727' located at a junction area 740", out-couples the light into the semiconductor detection region 717. As shown, the coupling constant is higher (e.g., the grating teeth are deeper) so that the out-coupling occurs in a shorter distance relative to the coupling grating 727. In FIG. 7B, a top view shows two pixels, each pixel comprising one of sensor element 700 and shown as 700-1 and 700-2. Each pixel is shown having a respective one of grating periods, p1 and p2, wherein the grating period p1 of pixel 700-1 is different than the grating period p2 of pixel 700-2.

Figure 8A:
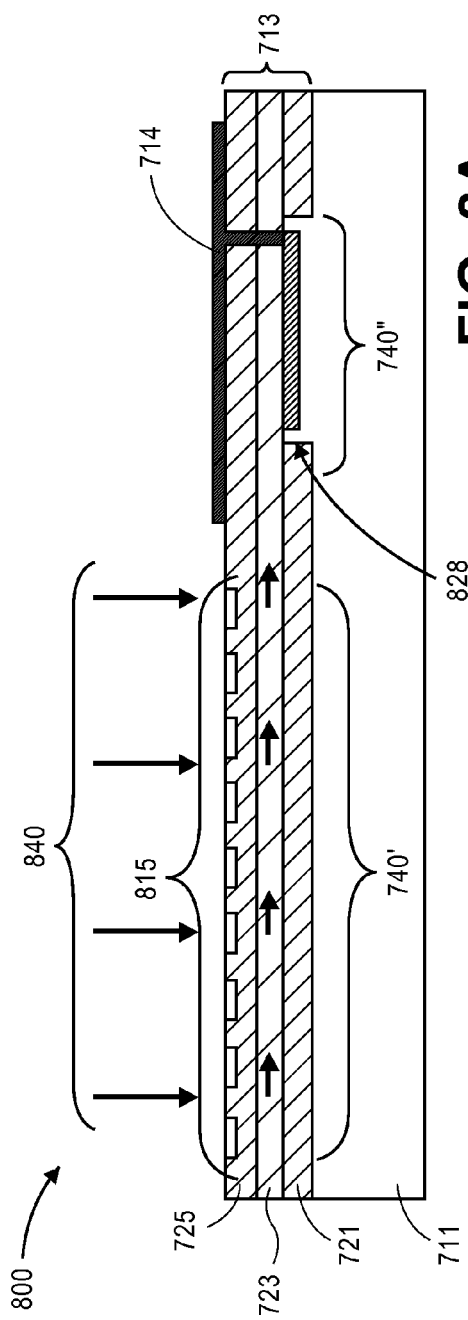
FIGS. 8A-8B illustrate a side cross-sectional view (FIG. 8A) and a top view (FIG. 8B) of a waveguide filter of an embodiment.
Figure 8B:
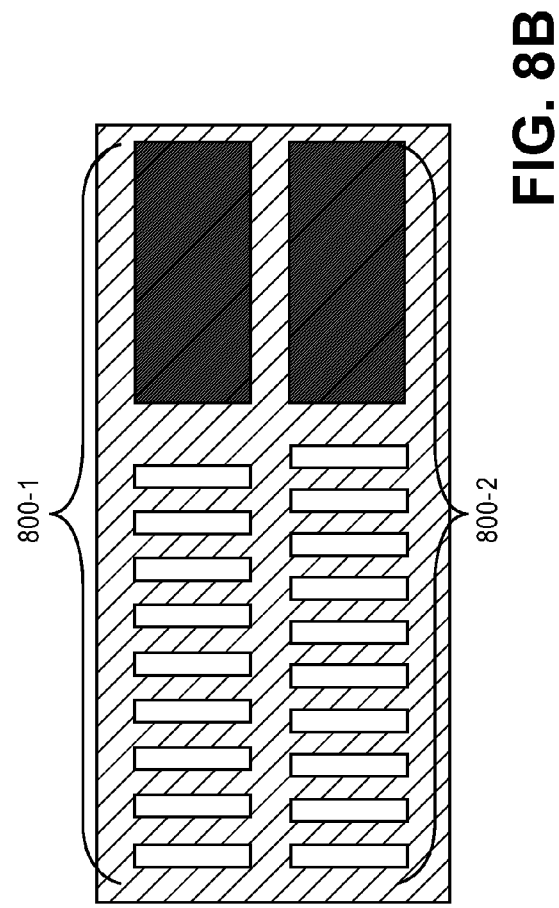

In another implementation shown in FIG. 8A, instead of having a second (out-coupling) grating such as second grating 727' of element 700, element 800 includes a pedestal portion 828 at a junction area 740". However, element 800 still includes a first grating 815 at a coupling area 740'. The pedestal portion 828, also located at the junction area 740" extends from the substrate so that the evanescent field from the lower index cladding layer 721 reaches the higher index silicon. That is, the out-coupling grating is replaced by a leaky mode outcoupling based on bringing the silicon p-n junction between n-type portion 719 and p-type substrate 711 into the cladding 721. Thus, in this leaky-mode geometry, the field will couple to radiative modes in the silicon and a signal will be detected. Manufacturing details will be important in deciding between these out-coupling alternatives. In FIG. 8B, a top view shows two pixels, each pixel comprising one of sensor element 800 and shown as 800-1 and 800-2. Each pixel is shown having a respective one of grating periods similar to the grating periods $p_1$ and $p_2$ of FIG. 7B, wherein the grating period $p_1$ is different than the grating period $P_2$.

The waveguide approaches described for the elements of FIGS. 7A-7B and 8A-8B have the same convolution of angular and spectral responses as the SPW approaches of the embodiments described above. Accordingly, the approaches presented above with respect to FIGS. 4 and 5A-5B can also be applied in the waveguide embodiments of FIGS. 6A-8B.

For a $SiO_2/Si_3N_4/SiO_2$ waveguide, the modal index of the slab waveguide can be between about 1.5 to about 2.2. The dielectric grating can comprise a first dielectric grating and the slab waveguide can further comprises a second dielectric grating disposed between the metal block and the semiconductor layer. The second dielectric grating can comprise a coupling constant that is higher than that of the first dielectric grating such that the second dielectric grating out-couples light into a detection region. The plurality of out-coupling gratings of the second dielectric grating can have a coupling strength greater than the coupling strength of the first plurality of gratings, thereby achieving a concentration of the optical signal. Each of the first and the second dielectric gratings can comprise a plurality of grating teeth, and the second dielectric grating's teeth can be thicker than the first dielectric grating's teeth. The first grating period can be different than the second grating period. A portion of the substrate disposed under the metal block can comprise a raised portion that extends the p-n junction into the first cladding layer.

In an embodiment, the p-n junction of the device described in FIGS. 8A-8B can be replaced by an interdigitated Schottky barrier (not illustrated) without requiring any doping. The fingers of the Schottky barrier contacts can also serve as the outcoupling grating.

Figure 9:
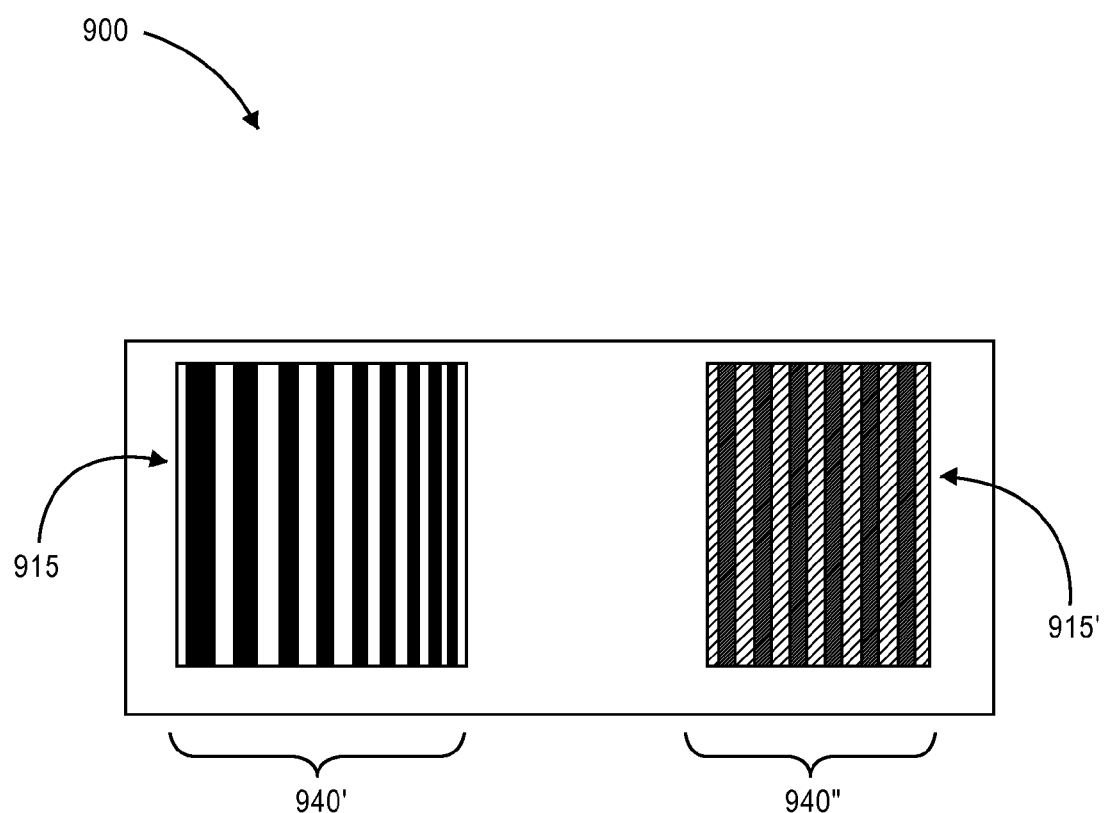
FIG. 9 is a top view of a waveguide filter of an embodiment and illustrates the use of a chirped grating to adjust the bandwidth of the detected light in an integrated sensor detector element.

As discussed above the bandwidth of the spectral selectivity for a fixed angle of incidence can be adjusted by changing the pitch of the coupling grating across the coupling region. This is illustrated in FIG. 9 which shows a top view of a sensor element 900 that is similar to sensor element 600' of FIG. 6C is illustrated. The sensor element 900 comprises a chirped grating 915 with a variable pitch across the coupling region and an out-coupling grating 915' in the junction region which may be fixed or chirped. For simplicity of representation, the top cover that prevents direct illumination of the junction area (e.g., 714 in FIG. 8A) is not shown in FIGS. 9-12B. The chirped grating 915 will be important in adjusting the spectral resolution for specific applications. In particular, typical light emitting diodes (LEDs) have bandwidths of ~20- to 40-nm, to assure appropriate coverage it is best to set the resolution of the measurement to ~20 nm.

Figure 10A:
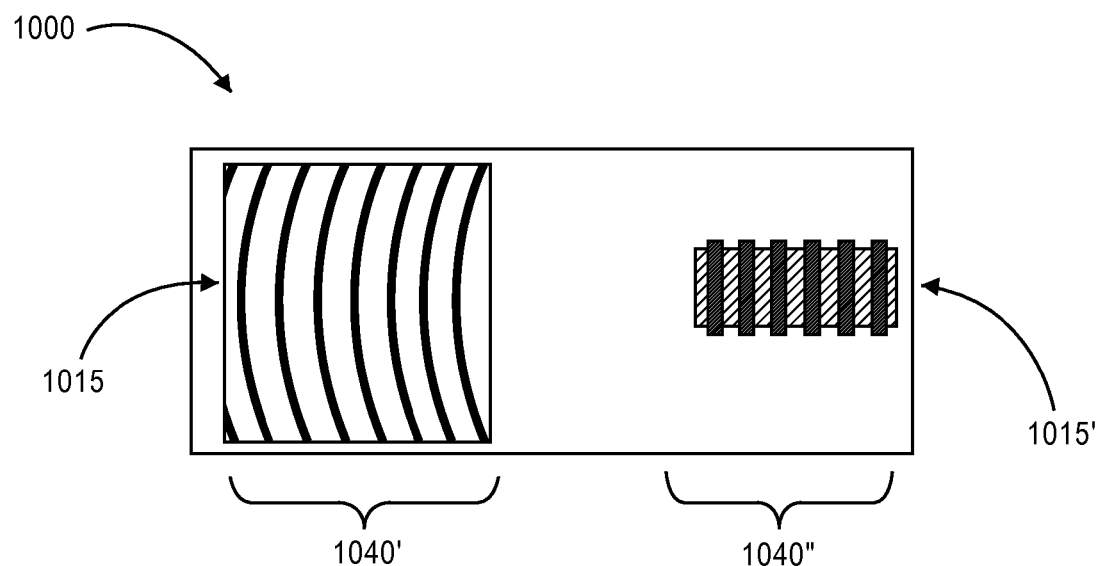
FIG. 10A is a top view of a waveguide filter of an embodiment and illustrates the use of a curved grating (FIG. 10A) and a smaller detector element.
Figure 10B:
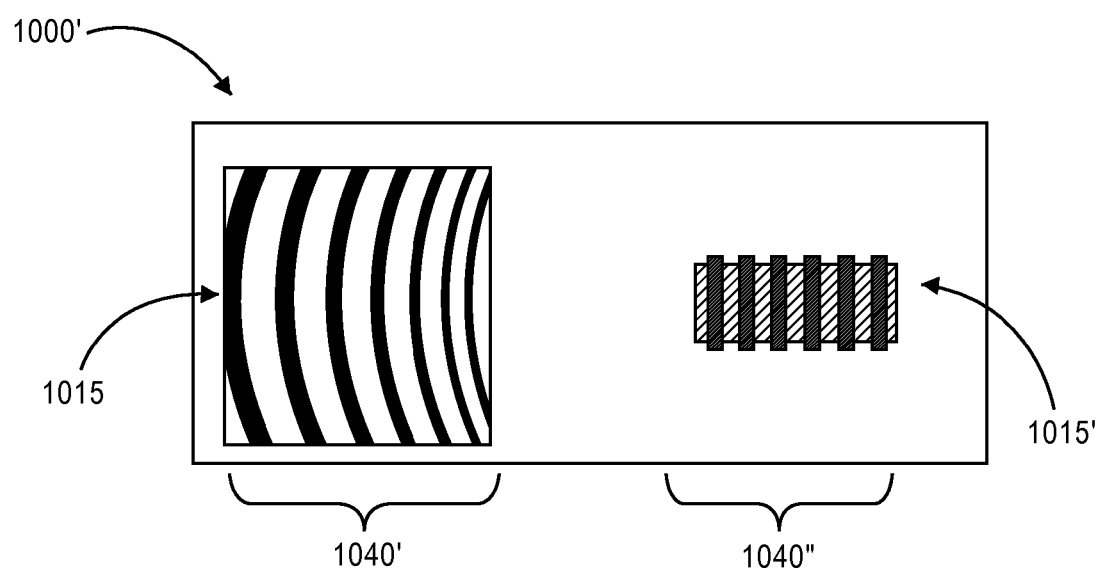
FIG. 10B is a top view of a waveguide filter of an embodiment and illustrates a combined chirped and curved grating coupler.

The coupling grating is not constrained to straight line segments. For example, in FIG. 10A, a top view of sensor element 1000 that is similar to sensor element 600' of FIG. 6C is shown. Sensor element 1000 comprises curved grating 1015 in the coupling region 1040' includes a set of curved grating segments. The curved grating 1015 serves to focus incoming light within the 2D waveguide slab (e.g., 613) to allow a smaller active junction area 1040" where outcoupling grating 1015' is located. This has advantages in terms of reduced areal space usage, in terms of reduced detector dark noise, and in terms of increase detector speed (reduced capacitance). In FIG. 10B, a sensor element 1000' that is similar to sensor element 600' of FIG. 6C comprises a grating 1015''' that is both curved and chirped at coupling region 1040". Thus the chirping to control the bandwidth and the focusing to reduce the size of the active junction area can be combined.

Figure 11:
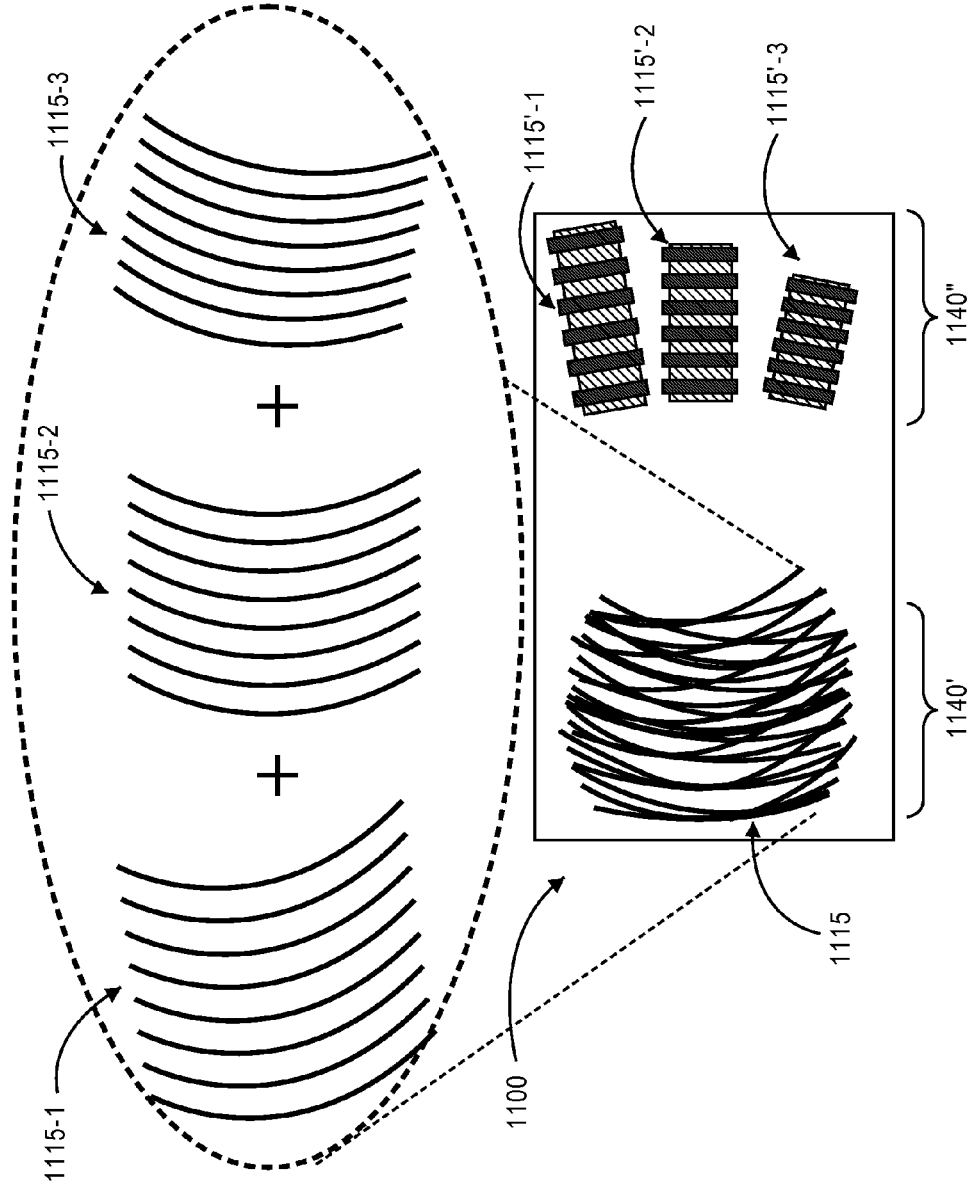
FIG. 11 is a top view of a waveguide filter of an embodiment and illustrates the use of more complex grating couplers in an integrated sensor detector element comprising a single coupling area with multiple junction areas.

In another embodiment, FIG. 11 shows a top view of a sensor element 1100 that is similar to sensor element 600' of FIG. 6C. Sensor element 1100 comprises multiple outcoupling gratings 1115'-1, 1115'-2 and 1115'-3 at junction areas with a common collection area across junction region 1140". As illustrated in FIG. 11, sensor element 1100 also includes three different pitch curved coupling gratings 1115'-1, 1115'-2 and 1115'-3, as shown in the inset, are combined to form the curved grating 1115. For example, each grating 1115'-1, 1115'-2 and 1115'-3 is tilted so that the foci are at different angles from a centerline. For simplicity, gratings 1115'-1, 1115'-2 and 1115'-3 are shown as single pitch gratings, but they can be chirped as well to adjust the bandwidth. These three gratings are shown overlapping in the bottom panel with three coupling gratings 1115'-1, 1115'-2 and 1115'3 at respective junction areas to receive the radiation collected by each grating across junction region 1140". The details of the collection area grating geometry can be adjusted to optimize the collected waveguide radiation into each of the junction areas.

Figure 13:
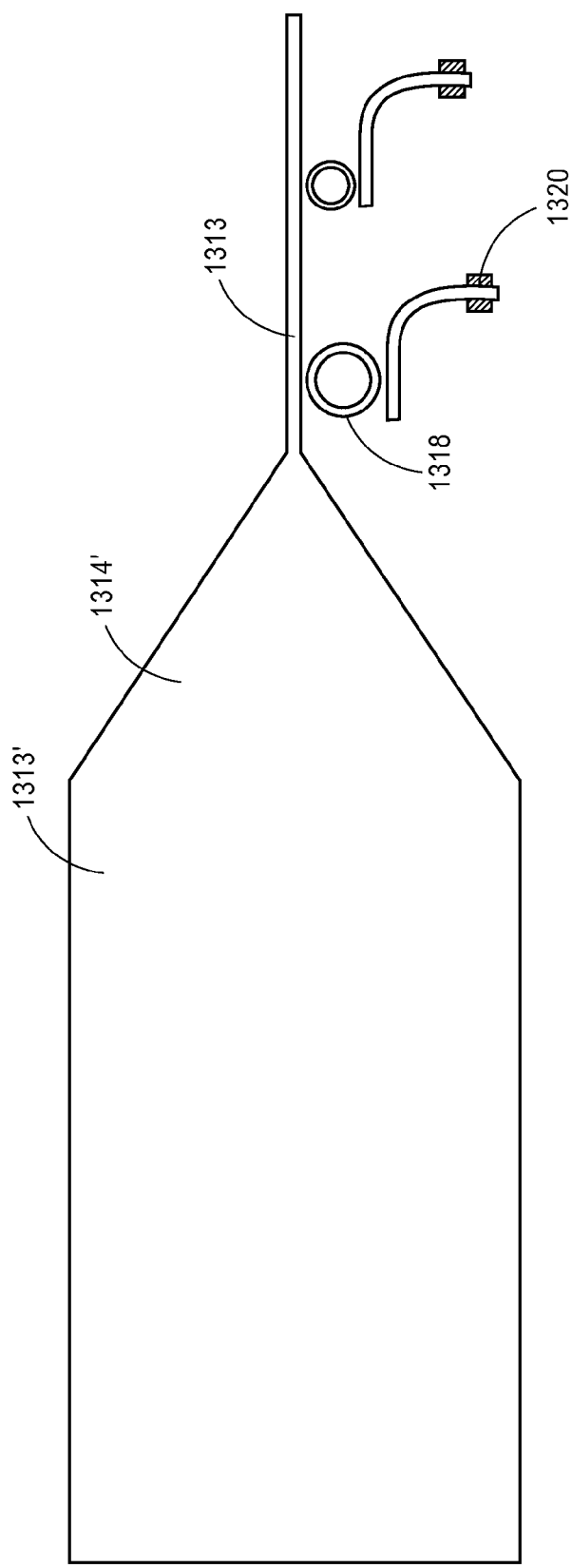
FIG. 13 illustrates an embodiment comprising a slab waveguide that is tapered on an end to a single mode guide that includes add-drop filters based on circular resonant whispering gallery structures for isolating various spectral regions.

FIGS. 12A-B illustrate additional collection schemes for embodiments of detector elements. FIG. 12A shows a top view of a sensor element 1200 that is similar to sensor element 600' of FIG. 6C. Sensor element 1200, however, comprises a crossed coupling grating 1215-1 which is shown as having different pitch gratings in the two orthogonal directions and located in a coupling region 1240'-1. For normal incident radiation the grating will couple the same wavelength to two of the junction areas (e.g. up/down and left/right junctions). For incident radiation off of normal, the two pairs of junction regions will be coupled to different wavelength radiation as described in equation (1) above. This concept is extended in FIG. 12B which shows a top view of a sensor element 1200' that is similar to sensor element 600' of FIG. 6C. Sensor element 1200' is shown with coupling grating 1215-2 at coupling region 1240'-2. Coupling grating 1215-2 comprises four chirped and curved gratings that are overlapped to feed input light into four junction areas with different angular/spectral responses to the junction area 1240"-1, 1240"-2, 1240"-3, and 1240"-4 at which respective ones of out-coupling gratings 1215'-1, 1215'-2, 1215'-3 and 1215'-4 are located. As above, the details of the coupling grating structure can be adjusted to optimize the system response, and the final details of the structure likely will not be a simple superposition of the individual grating structures. The out-coupling grating atop each junction area is adjusted to correspond to each in-coupling grating. This is not a critical adjustment since the absorption of Si is independent of the angle of incidence from the surface normal of the radiation. This concept is not inherently limited to four junction areas for a single collection area, but can be extended to provide additional functionality. For example, there can be four (or more) junction regions, such as at least one for each side of the square (or other shaped) coupling area In an alternative embodiment, a sensor element may include waveguide add/drop filters. For example, as shown in FIG. 13, a slab waveguide 1313' may be tapered to a single mode guide 1313. As a result of the angular/spectral combinations, the spectrum in this single mode guide will reflect particular combinations of angle and wavelength. Add-drop filters 918, which may be based on circular resonant whispering gallery structures, can be added to isolate various spectral regions. The add-drop filters 1318 may be used for providing the spectral analysis of the grating coupled light. The triangular section 1314' is an adiabatic taper to funnel the light into a single mode waveguide 1313. The add-drop filters may be resonant whispering gallery resonators and may lead to separate detectors 1320. Because the detectors can be much smaller than in the previous cases, the detection speed for such an embodiment can be significantly increased. This also leads to a concentration of the light, in effect a planar "lens" that provides enhanced signal-to-noise performance as compared with a large-area detector. Other wavelength resonant structures, well known in the art, can be used in place of or in combination with these whispering gallery structures.

As discussed above in connection with FIGS. 9-12B, there is opportunity for multiplexing the coupling region to provide some separation in angular/spectral domains. The slab waveguide 1313' can be any of the slab waveguides described above. For example, the slab waveguide may comprise a confinement layer disposed between a first cladding layer and a second cladding layer, wherein the first cladding and the second cladding each have a refractive index that is lower than a refractive index of the confinement layer, and a simple or complex dielectric grating disposed in the first cladding layer for coupling incident light into the slab waveguide. Each of the add-drop filters is in communication with a respective one of a junction region.

Additionally, sensors—such as photodetectors—that incorporate the sensor elements, such as in pixels of a 2-D pixel array, can provide detection of a restricted angular range or detection of a wide angular range. In an example, the restricted angular range is controlled by the use of baffles above the waveguide structure as in, for example, FIG. 3. In such a configuration, the sin θ value in equation (1) is fixed and only one variable remains. Thus, each coupling/junction region pair is exposed to a single wavelength for a simple grating. On the other hand, for detection of a wide angular range baffles are not used and there are different values of sin θ and λ that satisfy Eq. 1. Thus, there are potentially multiple wavelengths propagating from each coupling region to each junction region. Accordingly, a smart lighting system may be configured with an arrangement of light sources, such as at least one light emitting diode that emits light of at least one wavelengths. In the case of a plurality of light emitting diodes and/or a plurality of different wavelengths each wavelength may identified by the smart lighting system, for example respective identification signature broadcasted by at least one light emitting diode. The sensed light may be correlated to the electronic signature by underlying electronics portion of the smart light system. However, the sensor element embodiment of FIG. 13 provides an alternative for providing physical separation of light provided by a bank of add/drop filters 1318.

Example 1A—Waveguide Detector Element

A grating coupled waveguide detector element consisting of a dielectric waveguide over a silicon substrate with grating coupling of both incident radiation into the waveguide and out coupling from the waveguide into a silicon p-n junction spatially offset from the input coupler was constructed according to the architecture illustrated in FIG. 6A.

The parameters of the waveguide were chosen to provide a single (TE, TM) mode pair across the visible allowing the use of different gratings to adjust the individual pixel angular/wavelength coupling. For the first experiment a $SiO_2$ ($n_{SiO2}$~1.5) lower cladding with a thickness of 1 μm was used to assure low waveguide losses and to eliminate leakage into the silicon. The $Si_3N_4$ guiding layer was 200 nm thick ($n_{Si3N4}$~1.8) and the top cladding was adjusted to control the coupling strength. For the measurements reported here, a top-cladding thickness of ~30 nm, providing a coupling length that varied from ~2 mm (405 nm) to ~5 mm (652 nm). The coupling grating was a photoresist grating (thickness of 100 nm) with a period of 320 nm that extended over both the in and out-coupling (detector) regions. The photodiode is a standard p-n detector with a 0.5 μm junction depth fabricated on a silicon wafer with a CMOS compatible process.

Example 1B—Experimental Results

For initial testing of the waveguide filtered CMOS compatible photodetector of Example 1A, lasers as light sources were used to simplify the measurement. The fabricated devices were tested using diode-based, multi-mode RGB lasers of different wavelengths (652.3-, 532.2- and 407.8- nm). The experimental setup consisted of the laser light source followed by an infrared filter, polarizer, long focal length lens and an aperture to provide uniform illumination across the ~200×200 μm² coupling region and avoid any direct illumination of the junction region.

Figure 14A:
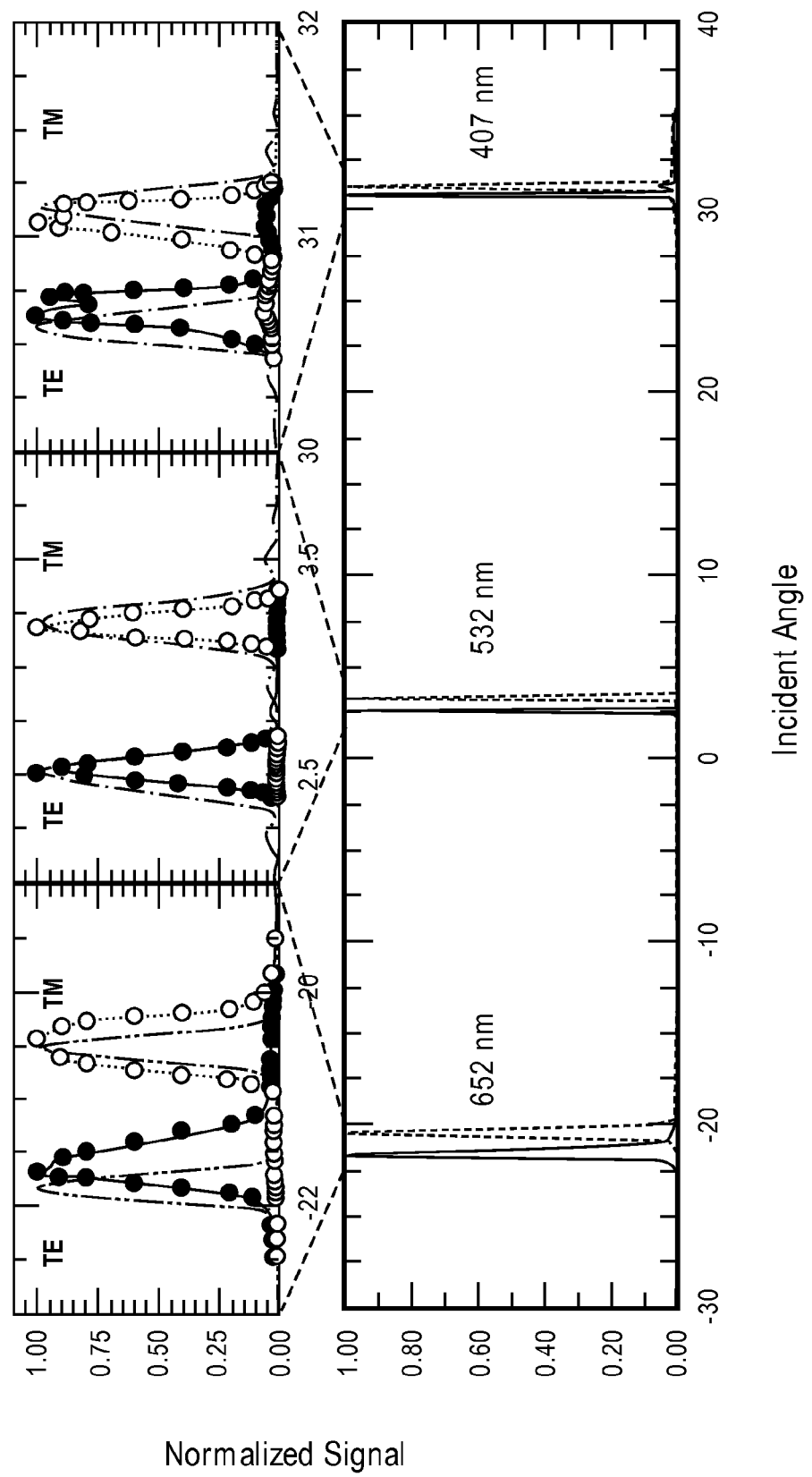
FIG. 14A is a graph showing experimentally obtained angular resolution of a single grating coupled waveguide detector for RGB laser sources of different wavelengths (652.3 nm, 532.2 nm and 407.8 nm). The expanded views show results for the TE (solid) and TM (dotted) experiments (circles) and simulations (dash-dot).

During the measurement, the illumination angle of incident beam relative to the grating is scanned, demonstrating the required angle/wavelength/polarization resolution. The measured angular spectra are wider than the theoretical predictions and show some fine structure, probably corresponding to the multi-mode character of the lasers. For these proof-of-principle experiments with bright sources, the photodetector was biased at 0V so that only the intrinsic depletion region is active. At each angle the measured photocurrent was normalized to the laser power to compensate for power fluctuations. The angular resolution varied from ~0.5° in the red to ~0.25° in the blue. FIG. 14A shows the normalized ratio of the measured photocurrent to the power of laser for the three wavelengths.

Example 2A—Waveguide Filtered CMOS Compatible Photodetector

A waveguide was chosen to provide a single (TE, TM) mode pair across the visible allowing the use of different gratings to adjust the individual pixel angular/wavelength coupling resonances. A photoresist coupling grating (thickness of 100 nm) with a period of 320 nm was extended across the entire device including both the in- and outcoupling (detector) regions. The coupling length varied from 1.5 mm (at 405 nm) to 3 mm (at 652 nm).

Example 2B—Experimental Results

For testing of the waveguide filtered CMOS compatible photodetector of Example 2A, we used lasers as light sources to simplify the measurement. The fabricated devices are tested using diode-based, multi-mode RGB lasers of wavelengths 652.3-, 532.2- and 407.8-nm. The experimental setup consisted of the laser light source followed by an infrared filter, polarizer, long focal length lens and an aperture to provide uniform illumination across the ~200× 200 μm2 coupling region and to avoid any direct illumination of the junction region.

Incoming light at the resonant wavelength and angle is scattered by the grating and couples into the waveguide, propagates to the junction area and is decoupled into the photodetector. Out-of-resonance light does not couple into the waveguide and is either reflected or transmitted into and absorbed in the silicon far from the photodetector active area and does not contribute to the photocurrent. The illumination angle of the incident beam relative to the grating was scanned with a resolution of 6 arc-sec.

Figure 14B:
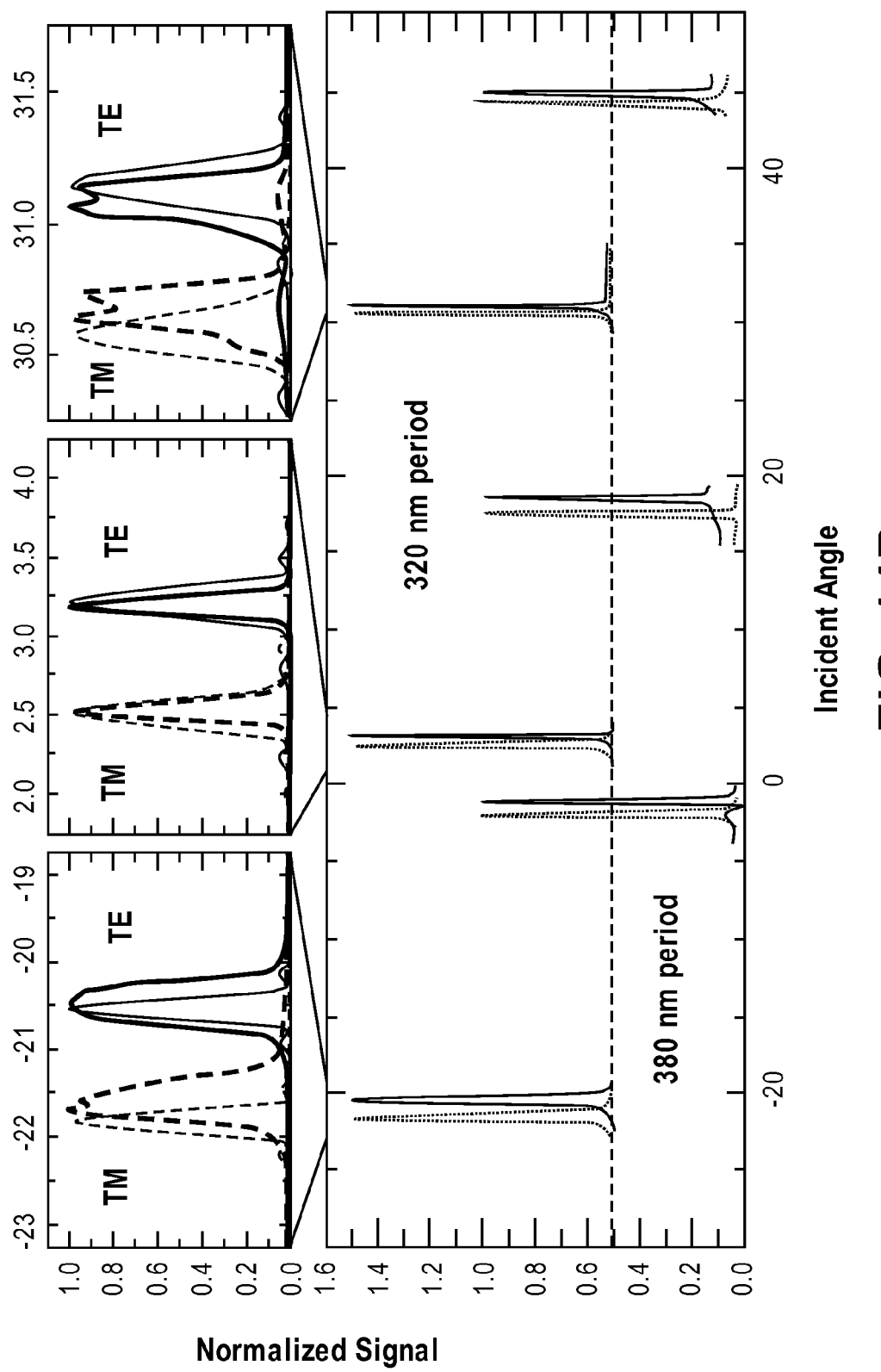
FIG. 14B is a graph showing experimentally obtained angular resolution of a single grating coupled waveguide detector for RGB laser sources. The bottom panel shows the results with the same waveguide with grating periods of 320- and 380-nm. The 320-nm grating results are expanded in the top panels and compared with simulation curves (shown as thicker curves).

FIG. 14B shows the normalized ratio of the measured photocurrent to the incident power of each laser source for two sets of measurements with the same waveguide structure but different grating pitches of 320- and 380-nm. The results for the two pitches are vertically offset for clarity. The measured angular spectra are slightly wider than the theoretical predictions (discussed below) and show some fine structure, probably corresponding to the multi-mode character of the lasers. The linewidth is a convolution of the scattering/absorption propagation losses of the bare (no grating) waveguide and the spectral width corresponding to the width of the coupling area (the smallest of physical dimension of the grating, the illumination spot size, or the coupling length). In these experiments, the laser spot size (~200 μm) is the major contribution to the observed linewidth.

Figure 14C:
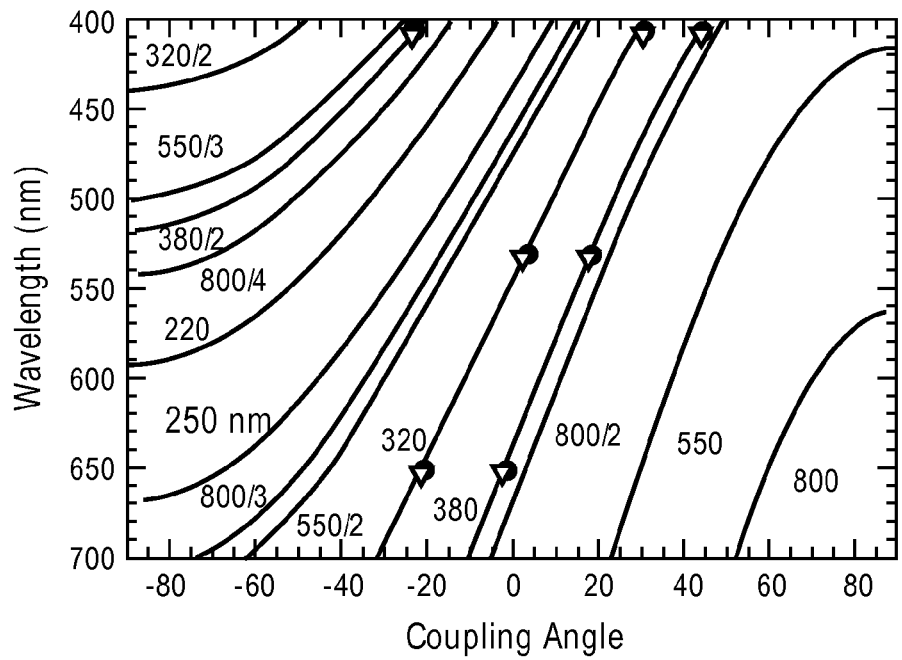
FIG. 14C-14D are graphs showing the angular spectral response for a particular implementation with the grating period as a parameter.
Figure 14D:
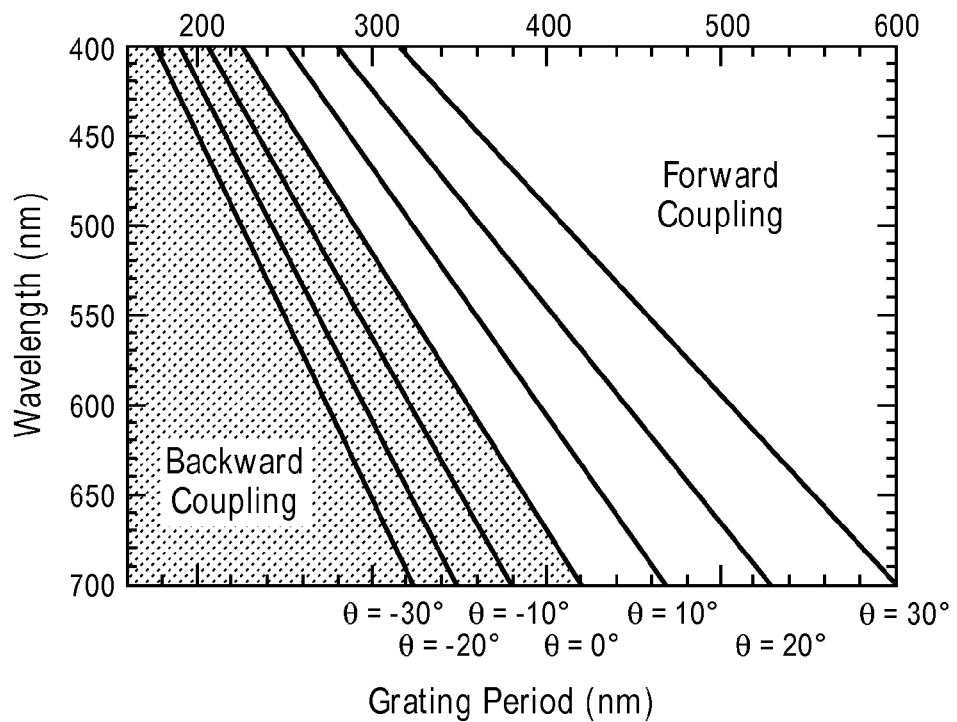

FIG. 14C shows wavelength vs. coupling angle for different grating periods. Multiple orders of the grating are shown. (e.g. the notation 800/2 refers the second order of a 800 nm pitch grating). The experimental points are indicated. FIG. 14D shows wavelength vs. grating period at a fixed angle. Both forward and backward scattering regimes are indicated. For both figures the solid lines are TE modes and the dotted lines are the TM modes.

Figure 15:
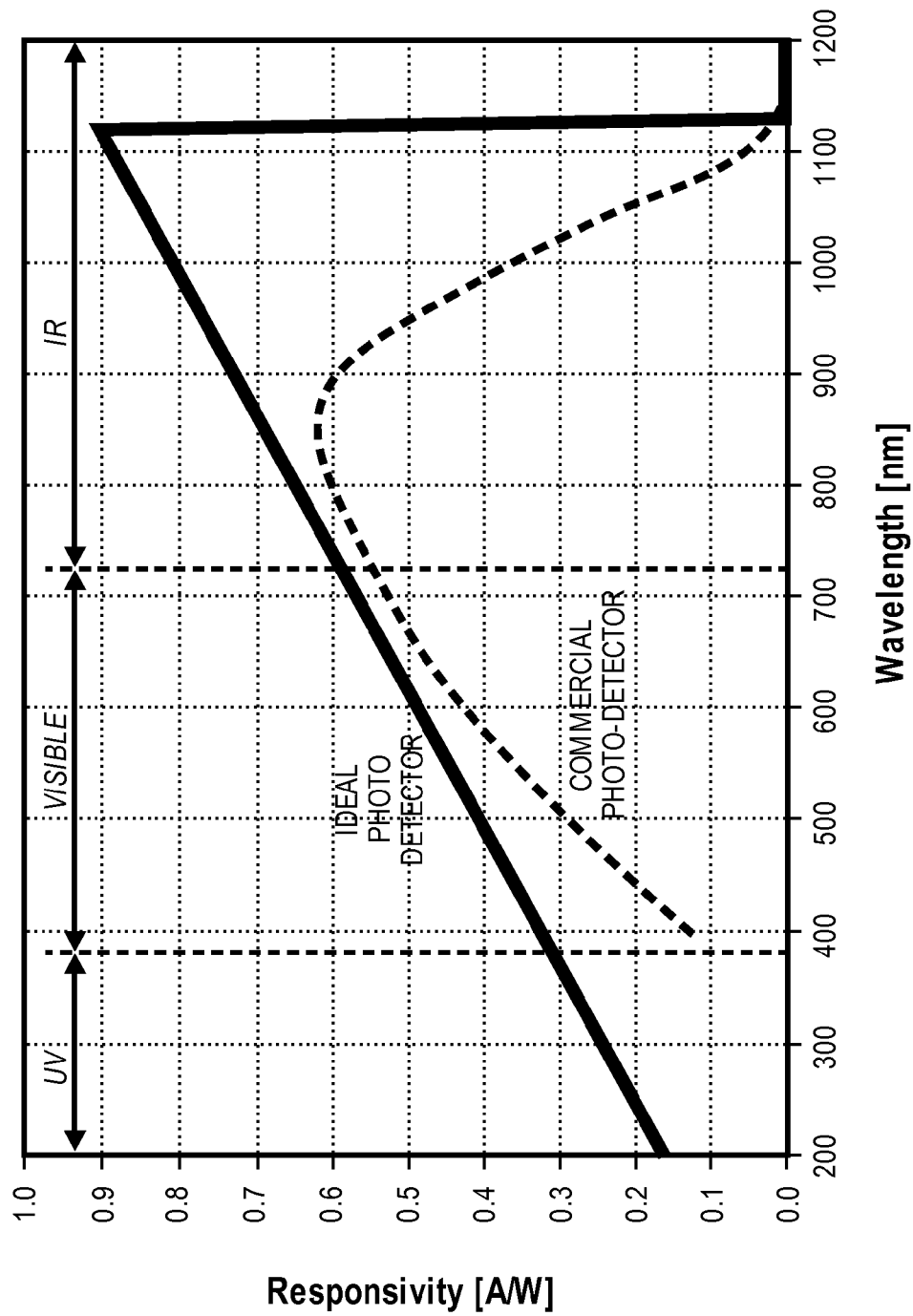
FIG. 15 is a graph showing the ideal (fundamental limit, unity quantum efficiency) and actual responsivities of an ideal photo-detector and a commercial photo-detector, respectively.

A High-Responsivity Blue-Enhanced CMOS Compatible Photodetector Using Honeycomb Structure Improved responsivity and detection of visible light colors (including blue) is one of the important specifications of light sensor for smart lighting. Since the energy of blue photons is the highest in the visible spectrum, the responsivity of photodetectors for blue photons is fundamentally the lowest (proportional to $\lambda$). That is, above the silicon bandgap energy (BG), the responsivity scales as $\lambda$/BG for a fixed quantum efficiency since only one electron-hole pair is generated for each photon absorption, independent of the wavelength. Furthermore the high absorption coefficient of silicon in the blue spectral region leads to a low quantum efficiency for conventional p-n junction detectors where the depletion region is buried some distance into the silicon. FIG. 15 shows the ideal (fundamental limit, e.g. the $\lambda$/BG response) and practical responsivities, which deviate from the ideal response at shorter wavelength, confirming that blue photons suffer from lowered sensitivity relative to longer wavelength photons.

Figure 16:
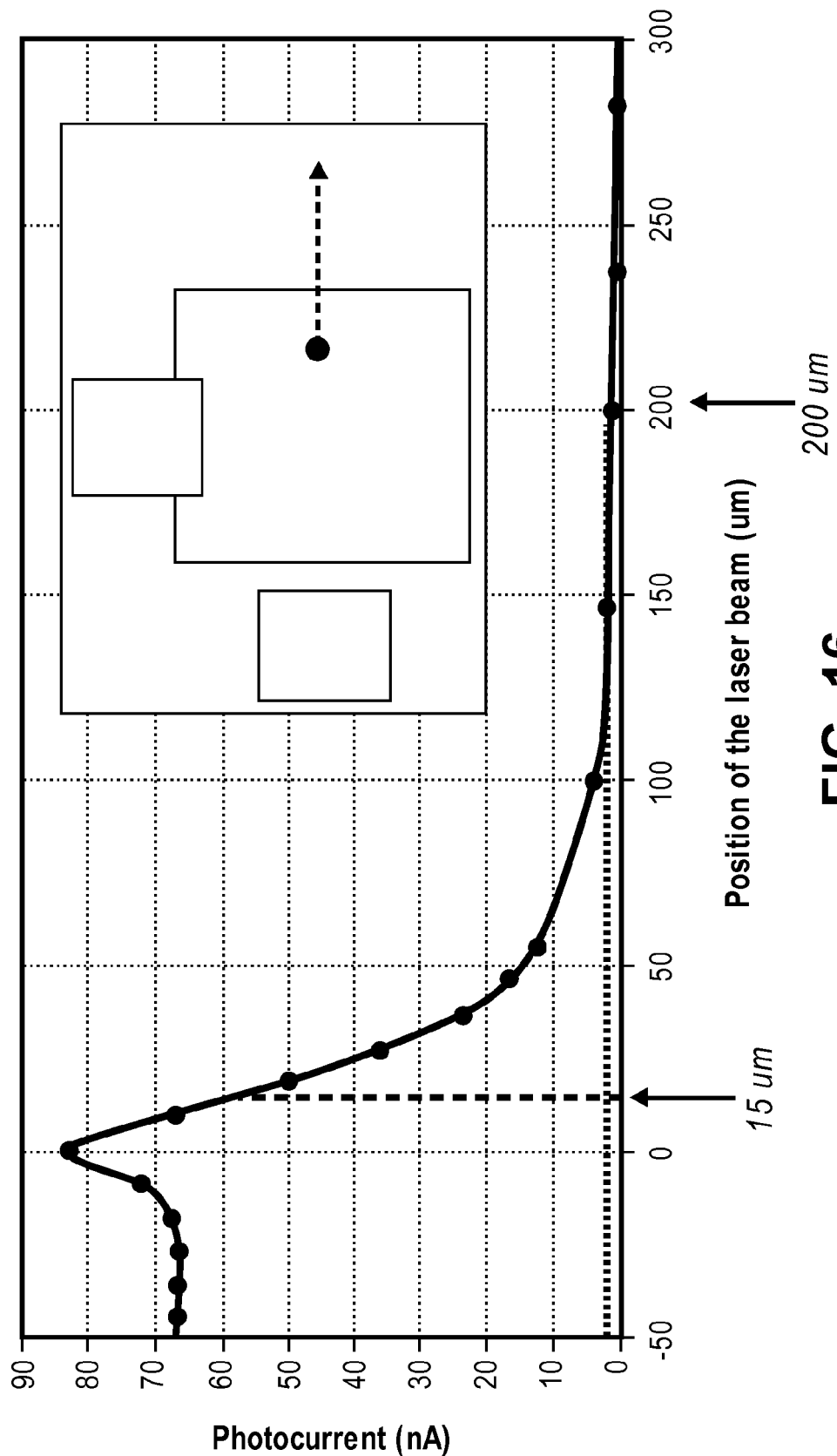
FIG. 16 is a graph showing measured responsivity (photocurrent) versus position of a laser beam on a fabricated photodetector.

Blue-enhanced photodetectors are available commercially; however, their fabrication requires a non-standard PIN process, which makes it cost inefficient. Because the absorption coefficient of blue photon is high, they normally get absorbed very close to the surface of the photodetector (at a 400 nm wavelength, the photon absorption length is ~100 nm). To enhance the quantum efficiency of blue photons, one must bring the depletion region as close as possible to the surface. This is practically very hard to fabricate, since the p or n region on the surface needs a minimum thickness. However, at the edge of a detector where for example a n-well is fabricated in a p-region, the depletion region already touches the surface. Therefore, the edge of a photodetector presents the highest responsivity. Experiments using a laser beam scanning technique on a simple, large-area planar p-n junction device, as illustrated in FIG. 16, confirm that the edge of a photodetector presents the highest responsibility. For example, there is a 22% overshoot in responsivity (photocurrent) when the laser beam reaches the edge of the detector (the direction of the laser beam is indicated by the right-pointing arrow in the inset). This enhancement is probably understated since it is averaged over the beam size, which limits the resolution and the peak enhancement.

Accordingly, in an embodiment there is a CMOS-compatible photodetector having structure that comprises a p-n junction. The edge portions of the p-n junction of the structure can be utilized to improve the detector responsivity. The structure has the appearance of a honeycomb, containing a large number of edges within the active photodetector area and an enhanced p-n junction area (depletion region volume).

Figure 17B:
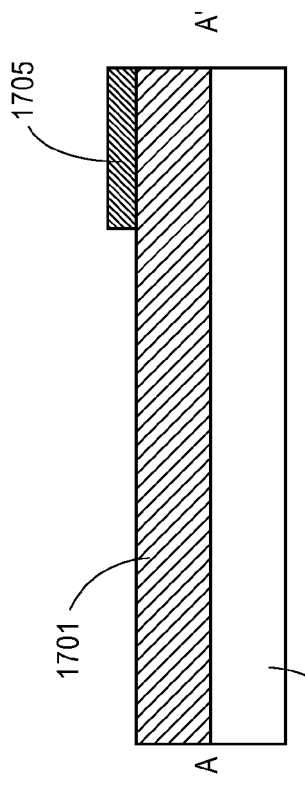
FIGS. 17A-17C illustrate a top view (FIG. 17A), a cross-sectional area of a first portion (FIG. 17B) and a cross-sectional area of a second portion (FIG. 17B) of a planar p-n detector. The substrate (p-) contact is not shown.
Figure 17C:
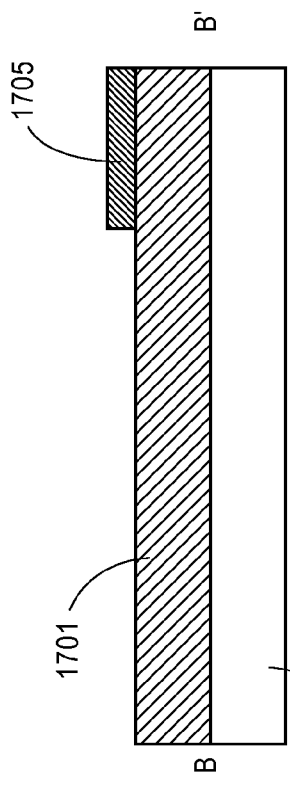
Figure 17A:
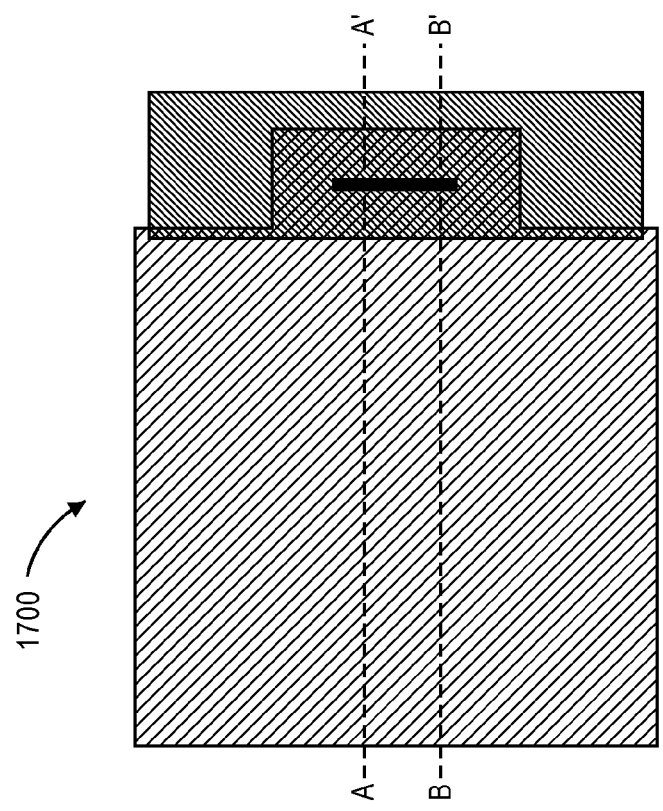

FIGS. 17A-17C illustrate top and side view (layout and cross section) of a conventional p-n detector 1700 having planar junction structure. As shown by the cross-sections of FIG. 17B and FIG. 17C taken along dashed line A-A' and B-B of FIG. 17A, respectively, a planar n-type layer 1701 is disposed over a planar p-type layer 1703. The two views show that across the device, the p-type and n-type layers are planar across a selected width of the device (i.e., the two views are identical).

Figure 18B:
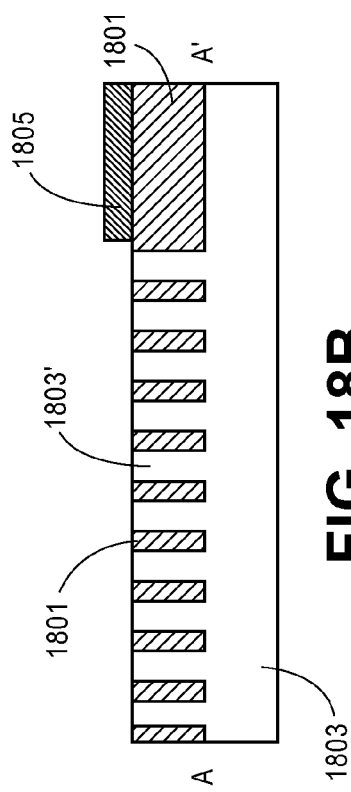
FIG. 18A-C is a top view (FIG. 18A), a cross-sectional view of a first portion (FIG. 18B) and a cross-sectional area of a second portion (FIG. 18C) of a CMOS-compatible honeycomb p-n detector of an embodiment.
Figure 18C:
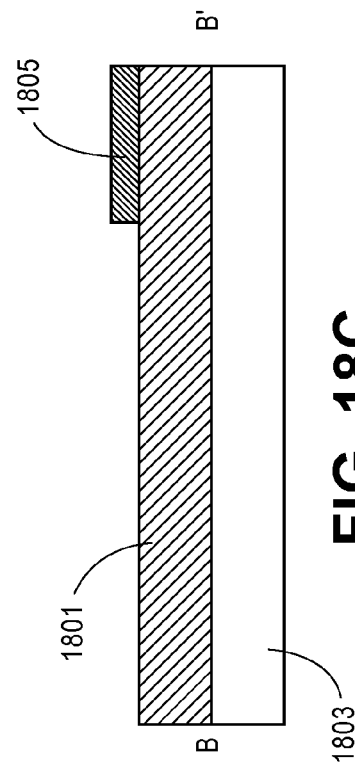
Figure 18A:
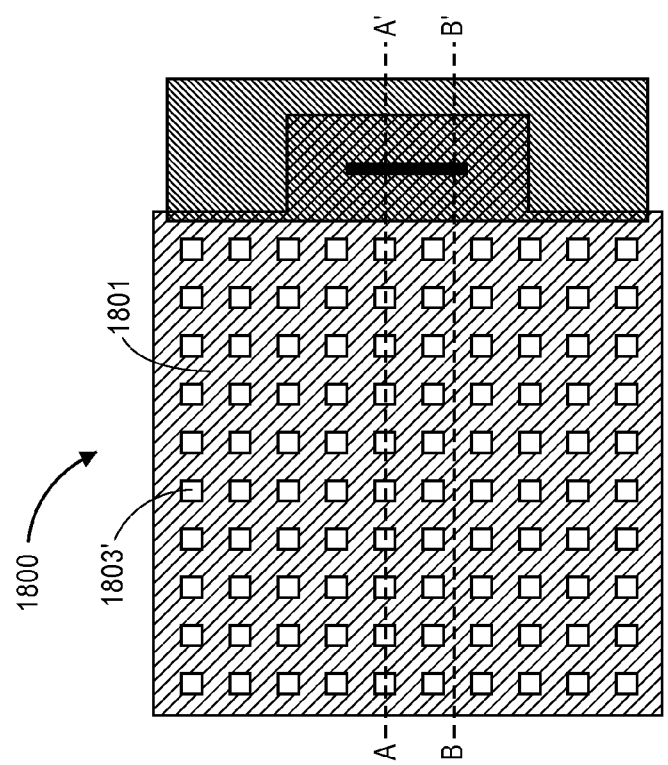

Meanwhile, FIGS. 18A-18C illustrate a top and side view (layout and cross section) of a honeycomb p-n detector structure 1800 of an embodiment that utilizes the junction edges to enhance the detector responsivity. The honeycomb p-n detector structure comprises a first semiconductor layer 1803 and a second semiconductor layer 1801. The first semiconductor layer 1803 may be doped with a first carrier type (for example, p-type dopant) and may include a plurality of posts 1803'. The second semiconductor layer 1801 may be doped with a second carrier type (for example, an n-type dopant) and may be configured with a plurality of holes extending through the second semiconductor layer. The holes may be arranged as an array of holes. The hole-containing pattern of the second semiconductor layer 1803 may be viewed as a plurality of interconnected open cells. Accordingly the holes may comprise the open portion of the open cells. In an embodiment the open cells may have any shape including any fractal shape.

The posts 1803' may extend through a corresponding one of the plurality of holes in a honeycomb pattern. In an embodiment, the honeycomb pattern comprises a plurality of edge portions, each of the plurality of edge portions comprising a respective one of a depletion region area. The honeycomb pattern, therefore, comprises a single p-n junction.

Two cross sections, corresponding to cuts labeled A-A' and B-B' are shown in FIGS. 18B and 18C, respectively. Cut A-A, through the center of the second semiconductor 1801's holes, is shown in FIG. 18B with posts 1803' extending through the holes in the second semiconductor layer 1801. Cut B-B', to the side of the second semiconductor 1801's holes, is shown in FIG. 18C with second semiconductor layer 1801 disposed on the first semiconductor 1803. The portion of the semiconductor layers 1801 and 1803 along cut B-B' are configured as layers 1701 and 1703 in the conventional detector design of FIG. 18C.

While FIG. 18A shows a honeycomb structure having a square honeycomb lattice, different configurations are possible, so long as all p-regions and all n-regions are electrically continuous. The more complex structure of the depletion region in the honeycomb photodetector enhances the responsivity across the visible. As discussed above, the blue response is enhanced by bringing the depletion region up to the surface of the silicon. For longer wavelengths—where the absorption depth is much further into the material—the enhanced volume of the convoluted depletion region, in comparison to the simple planar junction structure, leads to an enhanced response. The extended depletion region volume also corresponds to increased dark current and therefore to increased receiver noise. Many degrees of freedom are available to exploit in optimizing this photodetector. Such degrees of freedom include, but are not limited to the size and geometry of the honeycomb cells, the depth of the cells, the doping concentrations, etc. For different uses, e.g. high speed, high responsivity, low noise, there will be a different optimum. Each of these variants is incorporated herein.

The fabrication of the honeycomb detector does not require any additional mask or fabrication steps than a conventional planar photodetector. The honeycomb cells can be easily implemented by modifying the layout of the active region. The doping can be by any well-known doping technique such as diffusion or ion-implantation and annealing. Ion-implantation is advantageous for small honeycomb geometries and for high depth to planar dimension aspect ratios. Any one of the p-n junctions of the embodiments disclosed herein may be configured as a p-n honeycomb structure such as the p-n honeycomb structure 1800.

In other words, in an embodiment there is a CMOS-compatible photodetector comprising a first semiconductor layer in contact with a second semiconductor layer to form a p-n junction, wherein the photodetector comprises a plurality of edge portions within an active photodetector, each of the plurality of edge portions corresponding to a depletion region that extends in a direction perpendicular to the edge portion into both the p- and n-regions of the semiconductor, wherein the plurality of edge portions enhance detector responsivity, and further comprise a honeycomb structure.

In an embodiment there is a smart lighting system that comprises at least one of the 2-D arrays and/or CMOS compatible photodetector embodiments described herein. A 2-D sensor array and/or CMOS compatible photodetector of the embodiments can be in electrical communication with electronics. In an embodiment, the 2-D sensor array and/or CMOS compatible photodetector may be bump bonded to a silicon chip with the electronics. In an embodiment, 2-D sensor array and/or CMOS compatible photodetector may have the electronics for reading out the "pixel values" incorporated therein. The 2-D sensor array and/or CMOS compatible photodetector can have a spectral range of about 20 nm to about 50 nm over 7 to 21 spectral ranges across the 380 nm to 700 nm visible spectrum. In other embodiments there can be 420 detectors with ~1 nm spectral resolution to cover the visible The 2-D sensory array and/or CMOS Compatible photodetector can be configured to receive 10 to 13 angular samples of light at a polar angle of ~60° to 60° (f/1.75) at about 15° intervals, and 8 angles along 3 to 4 azimuthal angles separated by 120°. The 2-D sensory array and/or CMOS Compatible photodetector of at least one embodiment described above can further comprise about 150 pixels. The 2-D sensor arrays of the embodiments may be included in a CMOS compatible photodetector, with each pixel having a restricted angular acceptance of about 10° in both polar and azimuthal angles. For example, in a configuration where angular acceptance of each pixel is constrained, only one wavelength is coupled to each junction area and there is no need for a wavelength separation.

In an embodiment there is a method of using one or more of the 2-D sensor arrays and/or the CMOS compatible photodetectors described herein. For example, in use, light generates surface plasma waves bound to a metal-dielectric interface of the sensor. Alternatively, the light generates waveguide modes confined by a dielectric stack of the waveguide. Accordingly, the method may include providing a 2-D sensor array. The 2-D sensor array may include any of the sensor elements described herein. For example, the 2-D sensor array may include a semiconductor substrate comprising a plurality of pixels, which may be disposed on the substrate. Each of the plurality of pixels may comprise at least one coupling region and at least one junction region, a slab waveguide structure disposed on the semiconductor substrate that extends from the coupling region to the junction region, and at least one p-n junction in the junction region. A localized semiconductor layer may form the at least one p-n junction with the semiconductor substrate in the junction region. For example, the localized semiconductor layer may have a first conductivity type (for example, doped with a dopant having a first conductivity type such as p or n-type) and the substrate may have a second conductivity type (for example, doped with a dopant having a second conductivity type opposite that of the first type). The slab waveguide may include a confinement layer disposed between a first cladding layer and a second cladding layer, wherein the first cladding and the second cladding each have a refractive index that is lower than a refractive index of the confinement layer. The pixels may further comprise at least one grating disposed in the slab waveguide. The at least one grating may include a grating period. The method may also include coupling incoming light into the slab waveguide at the coupling region, propagating the light to the region over the junction area, decoupling the light such that it enters the junction region, and converting the light into at least one electron-hole pair, wherein the incoming light comprises at least one modulated waveform. The electron-hole pair may be collected, such as by electronics in communication with the 2-D sensor array such as electronics of a smart lighting system that includes the 2-D sensor array in electronic communication with a controller which in turn controls at least one, such as a plurality, of light sources.

The 2-D sensor arrays and/or the CMOS compatible photodetectors described herein comprise sensors, which receive optical input (e.g., a light field), and convert it into a meaningful electrical output. In an embodiment, the electrical output can be representative of a series of intensity vs. wavelength plots at different angles of incidence, or equivalently intensity vs. angle of incidence plots at different wavelength.

Figure 19A:
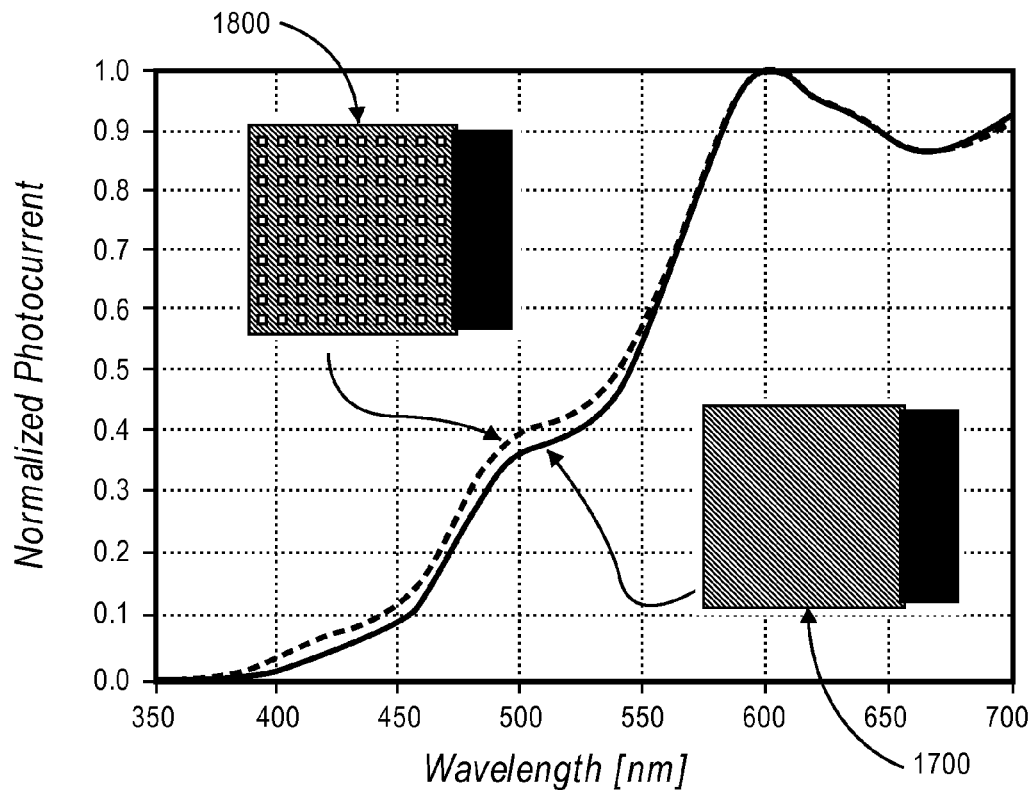
FIG. 19A is a graph showing spectral response data for detectors having a honeycomb p-n junction device of an embodiment versus a planar p-n junction of a typical detector.
Figure 19B:
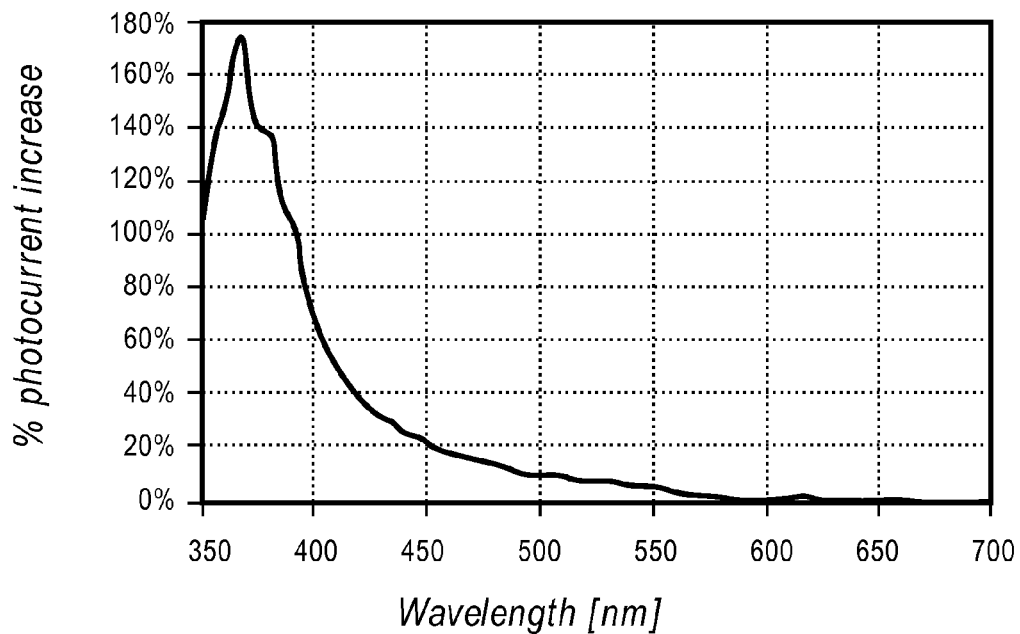
FIG. 19B is a graph showing photocurrent improvement achieved by the honeycomb structure.

FIG. 19A shows the spectral response of a conventional p-n detector (such as that of FIG. 17A) and a honeycomb p-n detector of the embodiments, such as that of FIG. 18A). The honeycomb detector demonstrates significant improvement in responsivity compared with the conventional detector. FIG. 19B shows the photocurrent increase of the honeycomb p-n detector relative to the conventional p-n detector.

While the invention has been illustrated respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function.

Furthermore, to the extent that the terms "including", "includes", "having", "has", "with", or variants thereof are used in either the detailed description and the claims, such terms are intended to be inclusive in a manner similar to the term "comprising." As used herein, the phrase "one or more of", for example, A, B, and C means any of the following: either A, B, or C alone; or combinations of two, such as A and B, B and C, and A and C; or combinations of three A, B and C.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:
1. A 2-D sensor array, comprising:
   a semiconductor substrate,
   a plurality of pixels disposed on the semiconductor substrate, wherein each of the plurality of pixels comprise:
      at least one coupling region and at least one junction region;
      a slab waveguide structure disposed on the semiconductor substrate and extending from the at least one coupling region to the at least one junction region, and comprising a confinement layer disposed between a first cladding layer and a second cladding layer, wherein the first cladding and the second cladding each have a refractive index that is lower than a refractive index of the confinement layer; and
      at least one coupling structure disposed in the coupling region and within the slab waveguide, the coupling structure comprising at least two materials having different indices of refraction, and arranged as a grating defined by a grating period, wherein the junction region comprises a p-n junction in communication with electrical contacts for biasing and collection of carriers resulting from absorption of incident radiation.

2. The 2-D sensor array of claim 1, further comprising electronics in electrical communication with the p-n junction, and wherein the p-n junction is biased to collect photogenerated carriers.

3. The 2-D sensor array of claim 1, wherein the at least one coupling structure comprises a first dielectric grating positioned in the coupling region for coupling incident light into the slab waveguide and a second dielectric grating positioned in the slab waveguide region over the junction region for coupling light from the waveguide into the junction region.

4. The 2-D sensor array of claim 3, wherein the second dielectric grating comprises a coupling constant that is higher than that of the first dielectric grating such that the second dielectric grating out-couples light into the p-n junction over a smaller spatial extent than that of the coupling region.

5. The 2-D sensor array of claim 3, wherein at least two of the plurality of pixels have different grating periods.

6. The 2-D sensor array of claim 3, wherein the first dielectric grating comprises a curved grating in the coupling region.

7. The 2-D sensor array of claim 3, wherein the first dielectric grating comprises a chirped and curved grating in the coupling region.

8. The 2-D sensor array of claim 3, wherein the first dielectric grating comprises a plurality of superimposed curved gratings, wherein at least two of the plurality of superimposed curved gratings have different pitches, and wherein the second grating comprises a plurality of gratings corresponding to each of the plurality of superimposed curved gratings.

9. The 2-D sensor array of claim 8, wherein the junction region comprises a plurality of junction regions.

10. The 2-D sensor array of claim 3, wherein the first dielectric grating comprises a cross-grating in the coupling area, the cross-grating comprising a first pitched grating with a first pitch and a second pitched grating with a second pitch, the second pitch grating arranged orthogonally to the first pitched grating,
   wherein at least one junction region comprises a first junction region and a second junction region, and
   wherein the second dielectric grating comprises a first out-coupling grating in the first junction region to accept waveguide light coupled by the first pitched grating and a second out-coupling grating in the second junction region to accept waveguide light coupled by the second pitched grating.

11. The 2-D sensor array of claim 3, wherein the first dielectric grating comprises a plurality of overlapping chirped and curved gratings in the coupling region,
   wherein the at least one junction region comprises a plurality of junction regions, and
   wherein the second dielectric region comprises a plurality of junction gratings, each of the junction gratings disposed in a respective one of the plurality of junction regions and having a respective one of an angular/spectral response.

12. The 2-D sensor array of claim 1, further comprising a metal block disposed above the slab waveguide to shield the p-n junction from direct illumination.

13. The 2-D sensor array of claim 12, further comprising a dielectric spacer disposed between the metal block and the slab waveguide.

14. The 2-D sensor array of claim 12, wherein the at least one coupling structure comprises a first dielectric grating positioned in the coupling region for coupling incident light into the slab waveguide and a second dielectric grating in the junction region disposed between the metal block and a localized junction area of the semiconductor substrate.

15. The 2-D sensor array of claim 12, wherein a portion of the substrate disposed under the metal block comprises a raised portion that extends the p-n junction into the first cladding layer.

16. The 2-D array of claim 1, the p-n junction comprises a first semiconductor layer doped with a first carrier type and comprising a plurality of posts, and a second semiconductor layer doped with a second carrier type configured with a plurality of holes extending through the second semiconductor layer and configured in a honeycomb pattern,
   wherein at least one of the posts extends through a corresponding one of the plurality of holes in the honeycomb pattern;
   wherein the honeycomb pattern comprises a plurality of edge portions, each of the plurality of edge portions comprising a respective one of a depletion region area.

17. The 2-D sensor array of claim 1, wherein the 2-D sensor array has a spectral range of about 20 nm to about 50 nm over 6 to 15 spectral ranges within the 400 nm to 700 nm visible spectrum.

18. A CMOS-compatible photodetector comprising:
   a first semiconductor layer doped with a first carrier type and comprising a plurality of posts, and a second semiconductor layer doped with a second carrier type configured with a plurality of holes extending through the second semiconductor layer, wherein at least one of the posts extends through a corresponding one of the plurality of holes in a honeycomb pattern, wherein the honeycomb pattern comprises a plurality of edge portions, each of the plurality of edge portions comprising a respective one of a depletion region area.

19. The CMOS-compatible photodetector of claim 18, wherein the honeycomb structure comprises a single p-n junction.

20. A method of detecting electromagnetic radiation, comprising:
   providing a 2-D sensor array, comprising:
      a semiconductor substrate comprising a plurality of pixels,
      wherein each of the plurality of pixels comprise:
         at least one coupling region and at least one junction region,
         a slab waveguide structure disposed on the semiconductor substrate and extending from the coupling region to the junction region, and
         a localized semiconductor layer forming at least one p-n junction with the semiconductor substrate in the junction region,
         wherein the slab waveguide comprises a confinement layer disposed between a first cladding layer and a second cladding layer, wherein the first cladding and the second cladding each have a refractive index that is lower than a refractive index of the confinement layer, and
         at least one grating disposed in the slab waveguide, the at least one grating comprising a grating period;

coupling incoming light into the slab waveguide at the coupling region;
propagating the light to the region over the junction area;
decoupling the light such that it enters the junction region; and
converting the light into at least one electron-hole pair;
wherein the incoming light comprises at least one modulated waveform.

21. The method of claim 20, wherein the at least one modulated waveform comprises a respective identification signature broadcasted by at least one light emitting diode.

* * * * *